United States Patent
Kim

(10) Patent No.: US 8,168,493 B2
(45) Date of Patent: May 1, 2012

(54) SEMICONDUCTOR MEMORY DEVICE AND METHOD OF MANUFACTURING THE SAME

(75) Inventor: Jongwon Kim, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/038,733

(22) Filed: Mar. 2, 2011

(65) Prior Publication Data

US 2011/0217817 A1    Sep. 8, 2011

(30) Foreign Application Priority Data

Mar. 5, 2010 (KR) .................. 10-2010-0019729

(51) Int. Cl.
*H01L 21/336* (2006.01)
*H01L 21/28* (2006.01)
(52) U.S. Cl. . 438/238; 438/384; 438/682; 257/E21.158; 257/E21.409
(58) Field of Classification Search .................. 438/238, 438/384, 682
See application file for complete search history.

(56) References Cited

U.S. PATENT DOCUMENTS

| | | | |
|---|---|---|---|
| 6,365,481 B1* | 4/2002 | Bonser et al. | 438/382 |
| 6,709,950 B2* | 3/2004 | Segawa et al. | 438/424 |
| 6,737,322 B2 | 5/2004 | Inoue et al. | |
| 7,396,767 B2* | 7/2008 | Wu et al. | 438/682 |
| 7,608,899 B2* | 10/2009 | Iwasaki et al. | 257/411 |
| 2002/0053711 A1* | 5/2002 | Chau et al. | 257/412 |
| 2006/0011996 A1* | 1/2006 | Wu et al. | 257/412 |
| 2007/0057331 A1* | 3/2007 | Satou et al. | 257/384 |
| 2007/0138557 A1* | 6/2007 | Ipposhi | 257/347 |
| 2007/0228427 A1* | 10/2007 | Matsui et al. | 257/288 |
| 2009/0039440 A1* | 2/2009 | Hokazono | 257/372 |
| 2009/0224305 A1* | 9/2009 | Hayashi | 257/316 |
| 2010/0102396 A1* | 4/2010 | Kanegae et al. | 257/384 |
| 2011/0127605 A1* | 6/2011 | Kim | 257/334 |

FOREIGN PATENT DOCUMENTS

| | | |
|---|---|---|
| JP | 2007-311566 | 11/2007 |
| JP | 2009-239028 | 10/2009 |
| KR | 1020070082991 | 8/2007 |

* cited by examiner

*Primary Examiner* — Alexander Ghyka
(74) *Attorney, Agent, or Firm* — F. Chau & Associates, LLC

(57) ABSTRACT

Provided are a semiconductor memory device and a method of manufacturing the semiconductor memory device. The semiconductor memory device includes a semiconductor substrate including a first active region and a second active region, a gate electrode including a silicide layer formed on the first active region and a resistor pattern formed on the second active region. A distance from a top surface of the semiconductor substrate to a top surface of the resistor pattern is smaller than a distance from a top surface of the semiconductor substrate to a top surface of the gate electrode.

10 Claims, 25 Drawing Sheets

SEMICONDUCTOR MEMORY DEVICE AND METHOD OF MANUFACTURING THE SAME

CROSS-REFERENCE TO RELATED APPLICATIONS

This U.S. non-provisional patent application claims priority under 35 U.S.C. §119 of Korean Patent Application No. 10-2010-0019729, filed on Mar. 5, 2010, the disclosure of which is hereby incorporated by reference herein in it's entirety.

BACKGROUND OF THE INVENTIVE CONCEPT (i) Technical Field

The present disclosure relates to semiconductor memory device and method of manufacturing the same, and more particularly, to a semiconductor memory device including a gate electrode having a more reduced sheet resistance and a resistor pattern having a uniform resistance and a method of manufacturing the same.

(ii) Description of the Related Art

Semiconductor memory devices may include word lines and resistors. As the integration of semiconductor memory devices increases, a line width of a word line may become finer. As a word line becomes finer, a sheet resistance of a conductive pattern may increase. Also, when a word line is formed of polysilicon, as a word line becomes finer, an RC time delay may increase during an operation of a memory device due to a high resistance of polysilicon and thereby performance of a semiconductor memory device may be deteriorated. Thus, a word line may include a silicide layer so as to reduce a sheet resistance together with miniaturization of a word line.

When a resistor pattern and a word line are formed at the same time, a silicide layer may also be formed on a top surface of the resistor pattern and the silicide layer which may in turn reduce a resistance of the resistor pattern. Thus, an area of a resistor pattern may increase so that a resistor pattern on a top surface of which a silicide layer is formed has a predetermined resistance. However, an increase of area of a resistor pattern may be an obstacle to a high integration of a semiconductor device.

SUMMARY

Embodiments of the inventive concept provide a semiconductor memory device. The semiconductor memory device may include a semiconductor substrate including a first active region and a second active region; a gate electrode including a silicide layer formed on the first active region; and a resistor pattern formed on the second active region. A distance from a top surface of the semiconductor substrate to a top surface of the resistor pattern is smaller than a distance from a top surface of the semiconductor substrate to a top surface of the gate electrode.

Embodiments of the inventive concept also provide a method of manufacturing a semiconductor memory device. The method may include forming a first conductive layer on a semiconductor substrate including a first active region and a second active region, forming a second conductive layer covering the first conductive layer on the first active region and defining an opening exposing a top surface of the first conductive layer on the second active region, forming a third conductive layer covering top surfaces of the first and second conductive layers on the first and second active regions, forming a gate electrode on the first active region and a resistor pattern on the second active region by patterning the first through third conductive layers and forming a silicide layer on the gate electrode by performing a silicidation process. The opening provides a height difference between top surfaces of the gate electrode and the resistor pattern and wherein the silicidation process is performed so as to prevent the silicide layer from being formed on the resistor pattern by the height difference.

Embodiments of the inventive concept may provide a method of manufacturing a semiconductor memory device. The method includes forming a tunnel insulating layer on a cell array region of a semiconductor substrate, forming a buffer insulating layer on a resistor region of the semiconductor substrate and a gate insulating layer on a peripheral circuit region of the semiconductor substrate, forming a first gate conductive layer on the tunnel insulating layer, the buffer insulating layer and the gate insulating layer, forming a first device isolation layer, a second device isolation layer and a third device isolation layer in the semiconductor substrate, thereby defining a first active region, a second active region, and a third active region in the cell array region, the resistor region and the peripheral region of the semiconductor substrate, respectively. The method further includes sequentially forming an intergate insulating layer and a second gate conductive layer on the first gate conductive layer, etching the second gate conductive layer and the intergate insulating layer in the resistor region to remove the second gate conductive layer and the intergate insulating layer from the resistor region, thereby forming an opening exposing the first gate conductive layer in the resistor region. The method further includes forming a third gate conductive layer conformally on the cell array region, the resistor region and the peripheral circuit region, patterning the third gate conductive layer, the second gate conductive layer, the intergate insulating layer, the first gate conductive layer, the buffer insulating layer, the gate insulating layer and the tunnel insulating layer together to form a cell gate electrode and a select gate electrode on the first active region, a resistor pattern on the second active region and a high voltage gate electrode on the third active region, forming an interlayer insulating layer covering the cell gate electrode, the select gate electrode, the resistor pattern and the high voltage gate electrode, etching the interlayer insulating layer so that top surfaces of the cell gate electrode, the select gate electrode and the high voltage gate electrode are exposed and forming a silicide layer on the exposed top surfaces of the cell gate electrode, the select gate electrode and the high voltage gate electrode by performing a silicidation process. Moreover, there is a height difference between the top surface of the cell gate electrode and a top surface of the resistor pattern such that the silicide layer is prevented from being formed on the resistor pattern by the height difference. In addition, the method further includes forming an upper insulating layer covering the silicide layer.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the figures.

DETAILED DESCRIPTION OF THE EXEMPLARY EMBODIMENTS

Figure 1:
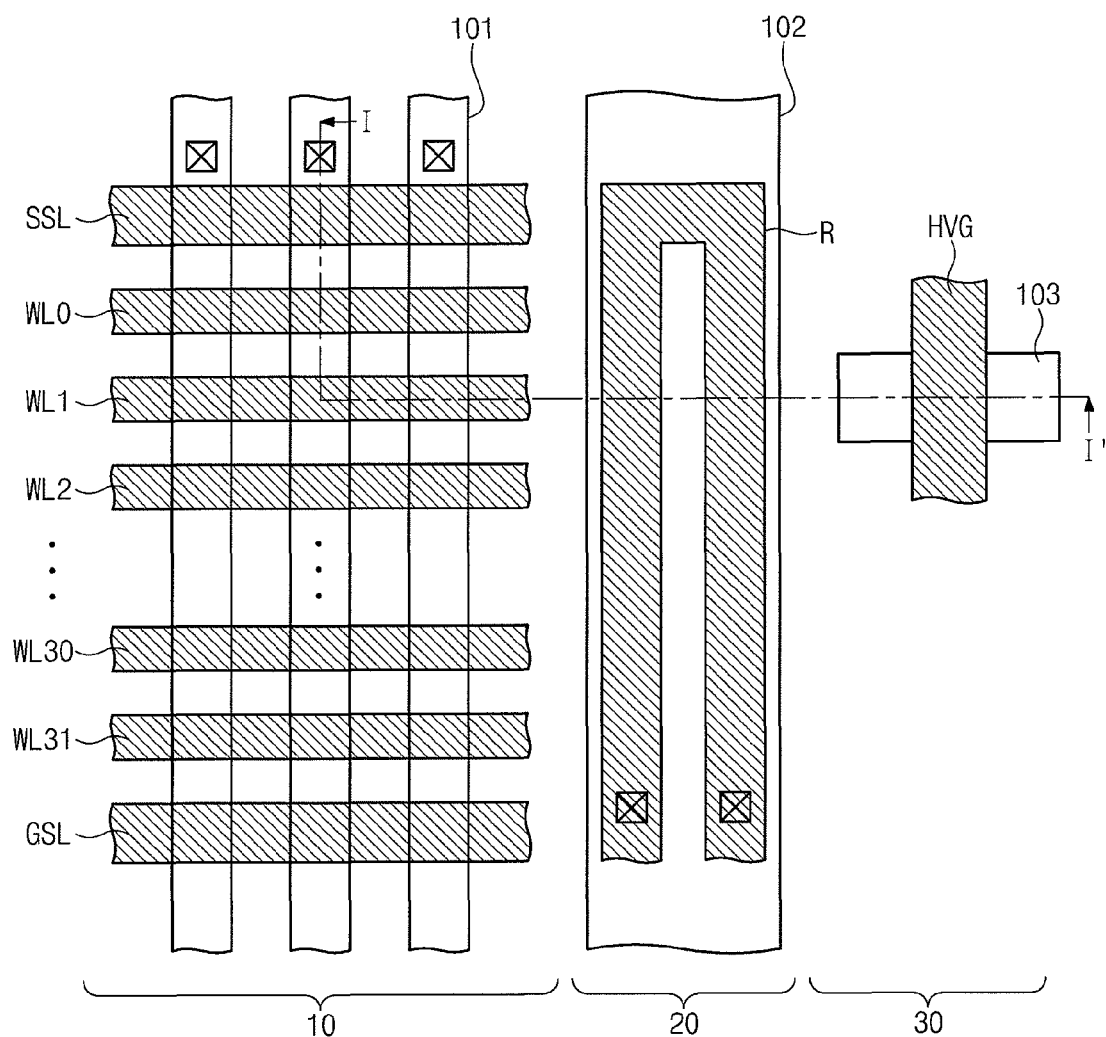
FIG. 1 is a top plan view of a semiconductor memory device in accordance with an exemplary embodiment of the inventive concept.

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the inventive concept may be described with reference to cross-sectional illustrations, which are schematic illustrations of idealized embodiments of the present invention. In the drawings, the thickness of layers and regions are exaggerated for clarity. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Figure 2:
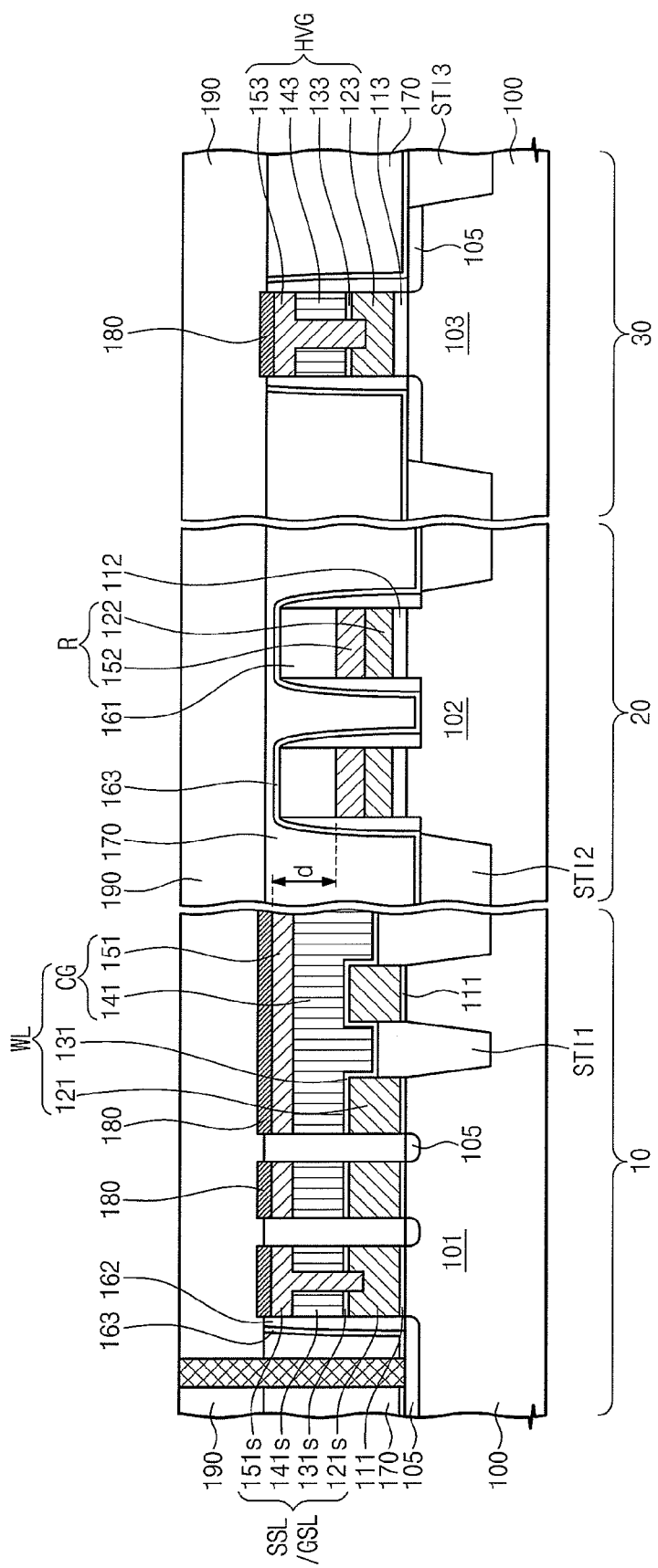
FIG. 2 is a cross sectional view of a semiconductor memory device in accordance with an exemplary embodiment of the inventive concept, which is taken along the line I-I' of FIG. 1.

FIG. 1 is a top plan view of a semiconductor memory device in accordance with embodiments of the inventive concept. FIG. 2 is a cross sectional view of a semiconductor memory device in accordance with an embodiment of the inventive concept, which is taken along the line I-I' of FIG. 1.

Referring to FIGS. 1 and 2, a semiconductor substrate 100 includes a cell array region 10, a resistor region 20 and a peripheral circuit region 30.

The cell array region 10 includes a first active region 101 defined by a device isolation layer (STI1), the resistor region 20 includes a second active region 102 defined by a device isolation layer STI2 and the peripheral circuit region 30 includes a third active region 103 defined by a device isolation layer STI3.

The first through third active regions 101 through 103 may be defined by different flat shapes from one another. For example, a NAND flash memory cell may be formed in the cell array region 10 and with this view, the first active region 101 of a line shape may be defined. The device isolation layer STI1 defining the first active region 101 may protrude from a top surface of the semiconductor substrate 100. Vertical thicknesses of the device isolation layers STI1, STI2 and STI3 may also be different from one another in the cell array region 10, the resistor region 20 and the peripheral circuit region 30.

In the cell array region 10, cell gate electrodes WL, a string select gate electrode SSL and a ground select gate electrode GSL are disposed to cross the first active region 101. In the resistor region 20, a resistor pattern R is disposed on the second active region 102 and in the peripheral circuit region 30, a low voltage gate electrode (not illustrated) and a high voltage gate electrode HVG are disposed to cross the third active region 103.

The cell gate electrode WL, the string and ground select gate electrodes SSL and GSL, the low voltage gate electrode (not illustrated) and the high voltage gate electrode HVG that are disposed on the first and third active regions 101 and 103 may have substantially the same height (e.g., a distance from a surface of the semiconductor substrate 100 to a top surface of the gate electrode). The resistor pattern R on the second active region 102 may have a height lower than the gate electrodes SSL, WL and HVG on the first and third active regions 101 and 103.

Also, impurity regions 105 are disposed in the active regions 101 and 103 of both sides of the cell gate electrodes WL, the select gate electrodes SSL and GSL and the high voltage gate electrode HVG.

A tunnel insulating layer 111 is interposed between the first active region 101 and the cell gate electrode WL. The cell gate electrode WL includes a floating gate electrode 121, an intergate insulating layer 131, a control gate electrode CG and a silicide layer 180 which is the top layer.

For example, the tunnel insulating layer 111 and the floating gate electrode 121 may be locally formed at a portion where the first active region 101 and the control gate electrode CG cross. The floating gate electrode 121 is formed of a first gate conductive pattern 121 and the control gate electrode CG is formed of second and third gate conductive patterns 141 and 151.

The tunnel insulating layer 111 may be formed of, for example, a silicon oxide layer. The tunnel insulating layer 111 may be, for example, a thermal oxide layer thinly formed on the semiconductor substrate 100. When data write and data erase operations of a flash memory device are performed, charges tunnel the tunnel insulating layer 111 by a F-N tunneling to move the semiconductor substrate 100 and the first gate conductive pattern 121.

The first gate conductive pattern 121 may be formed of, for example, a polysilicon layer doped with an n-type or a p-type impurity and may upwardly protrude from a top surface of the device isolation layer STI1. When a flash memory device operates, charges which tunneled the tunnel insulating layer 111 are accumulated in the first gate conductive pattern 121.

A sidewall of the tunnel insulating layer 111 and a lower sidewall of the first gate conductive pattern 121 may directly contact the device isolation layer STI1.

The intergate insulating layer 131 insulates the floating gate electrode 121 and the control gate electrode CG from each other and may be formed of a dielectric layer having a high dielectric constant. The intergate insulating layer 131 may have, for example, a laminated structure of lower oxide layer/nitride layer/upper lower layer to increase a dielectric constant. The lower oxide layer and the upper oxide layer may be formed of a metal oxide such as, for example, aluminum oxide ($Al_2O_3$), hafnium oxide ($HfO_2$), zirconium oxide ($ZrO_2$), lanthanum oxide ($La_2O_3$), tantalum oxide ($Ta_2O_3$) titanium oxide ($TiO_2$), strontium titanate $SrTiO_3$(STO), barium strontium titanate (Ba, Sr)$TiO_3$(BST) and so on and the nitride layer may be formed of, for example, a silicon nitride layer (SixNy, x and y are a positive integer). Also, the intergate insulating layer 131 may conformally extend onto a top surface of an adjacent device isolation layer STI1. The intergate insulating layer 131 can cover a top surface and both sidewalls of the first gate conductive pattern 121. Accordingly, a contact area between the first gate conductive pattern 121 and the intergate insulating layer 131 increases and thereby a coupling ratio between the control gate electrode CG and the floating gate electrode 121 may increase.

The control gate electrode CG may include the second and third gate conductive patterns 141 and 151 that are stacked. The second and third gate conductive patterns 141 and 151 are formed of, for example, a polysilicon layer doped with an n-type or a p-type impurity. On the intergate insulating layer 131, the second and third gate conductive patterns 141 and 151 cross the first active region 101. The control gate electrode CG may be formed between the protruded first gate conductive patterns 121 and thereby interference between adjacent floating gate electrodes 121 can be suppressed.

The silicide layer 180 is formed on a top surface of the control gate electrode CG to reduce a resistance of the cell gate electrode WL. The silicide layer may be, for example, a cobalt silicide layer, a titanium silicide layer or a nickel silicide layer.

A select gate insulating layer 111 is interposed between the first active region 101 and the select gate electrodes SSL and GSL and may have substantially the same laminated structure as the tunnel insulating layer 111.

The select gate insulating layer 111 may be formed to have substantially the same material and thickness as the tunnel insulating layer 111 of the cell gate electrode WL. A silicide layer 180, which has the same material and thickness as the silicide layer 180 formed on the top layer of the cell gate electrode WL, is disposed on a top surface of the select gate electrodes SSL and GSL.

For example, the select gate electrodes SSL and GSL may include lower gate conductive pattern 121s and upper gate conductive patterns 141s and 151s. The lower gate conductive pattern 121s of the select gate electrodes SSL and GSL is formed of the same material as the first gate conductive pattern 121 of the cell gate electrode WL and a top surface of the lower gate conductive pattern 121s may be even with the top surface of the first gate conductive pattern 121. Also, the upper gate conductive pattern 141s and 151s of the select gate electrodes SSL and GSL are formed of the same material as the control gate electrode CG of the cell gate electrode WL. That is, the upper gate conductive pattern 141s and 151s may be formed of second and third gate conductive pattern 141 and 151 that are stacked.

The select gate electrode SSL and GSL may include a residual insulating pattern 131s between the lower gate conductive pattern 121s and upper gate conductive patterns 141s and 151s, which has substantially the same material and thickness as the intergate insulating layer 131 of the cell gate electrode WL. A portion of the upper gate conductive pattern 151s penetrates upper gate conductive pattern 141s and the residual insulating layer 131s to directly contact the lower gate conductive pattern 121s, thereby electrically connecting the lower gate conductive patterns 121s and upper conductive patterns 141s and 151s.

The resistor pattern R on the second active region 102 includes lower and upper resistor patterns 122 and 152 and a buffer insulating layer 112 is interposed between the resistor pattern R and the second active region 102. According to an embodiment, the resistor pattern R on the second active region 102 is spaced apart from the device isolation layer STI2. According to another embodiment, a portion of the resistor pattern R may overlap with the device isolation layer STI2. In this case, a horizontally overlapped area between the device isolation layer STI2 and the resistor pattern R may be smaller than one tenth of an area that the resistor pattern R occupies the second active region 102.

For example, the buffer insulating layer 112 on the second active region 102 may be formed from a silicon oxide layer. The buffer insulating layer 112 may have the same thickness as the tunnel insulating layer 111 on the first active region 101 and may also have the same thickness as the high voltage gate insulating layer 113 on the third active region 103. A distance between a bottom surface of the resistor pattern R and a top surface of the semiconductor substrate 100 may be smaller than one tenth of a thickness of the device isolation layer STI2.

The lower resistor pattern 122 may be formed of the same material as the first gate conductive pattern 121 of the cell gate electrode WL. That is, the lower resistor pattern 122 may be formed from, for example, a polysilicon layer doped with an impurity. A thickness of the lower resistor pattern 122 may be equal to or smaller than a thickness of the first gate conductive pattern 121.

The upper resistor pattern 152 may be formed of the same material and thickness as the third gate conductive pattern 151 of the control gate electrode CG. That is, the lower resistor pattern 122 may be formed from, for example, a polysilicon layer doped with an impurity. A top surface of the upper resistor pattern 152 may be located to be lower than a top surface of the third gate conductive pattern 151 of the control gate electrode CG. Also, a top surface of the upper resistor pattern 152 may be located to be lower than a top surface of the third gate conductive pattern 151 of the select gate electrode SSL and GSL and a top surface of the third gate conductive pattern 151 of the high voltage gate electrode HVG. A hard mask pattern 161 formed of an insulating material is formed on a top surface of the upper resistor pattern 152.

A height difference d (e.g., a difference between a top surface of the cell gate electrode WL and a top surface of the resistor pattern R) may exist between the cell gate electrode WL and the resistor pattern R. The height difference d between the cell gate electrode WL and the resistor pattern R, as will be described with reference to FIG. 14, can prevent the silicide layer 180 from being formed on a top surface of the resistor pattern R when forming the silicide layer 180 on a top surface of the cell gate electrode WL. Also, a height difference exists between the resistor pattern R and the select gate electrode SSL and GSL on the top layer of which the silicide layer 180 is formed and between the resistor pattern R and the high voltage gate electrode HVG on the top layer of which the silicide layer 180 is formed.

The height difference d between the cell gate electrode WL and the resistor pattern R may be substantially equal to or smaller than a distance between a top surface of the first gate conductive pattern 121 and a bottom surface of the third gate conductive pattern 151 of the cell gate electrode WL. The height difference d between the cell gate electrode WL and the resistor pattern R may become different depending on a thickness of the second gate conductive pattern 141 of the cell gate electrode WL.

A sheet resistance of the resistor pattern R is determined by a width and a height of the resistor pattern R. Here, since a width of the resistor pattern R is determined by a line width in a photolithography process and an etching process, a change by process steps may be small. A height of the resistor pattern R is determined by thicknesses of the lower and upper resistor patterns 122 and 125. Therefore, a resistance of the resistor pattern R may become different according to a height of the resistor pattern R, that is, thicknesses of the lower and upper resistor patterns 122 and 152.

When the resistor pattern R is formed on a field region (e.g, device isolation layer STI2), a distance from a top surface of the semiconductor substrate 100 to a bottom surface of the resistor pattern R may be variable. For example, since the device isolation layer STI2 protrudes from a top surface of the semiconductor substrate 100 or a dishing phenomenon occurs on a surface of the device isolation layer STI2, a thickness of the device isolation layer STI2 may be non-uniform. Thus, a distance between a bottom surface of the resistor pattern R formed on the device isolation layer STI2 and a top surface of the semiconductor substrate 100 may become different. In this case, even though the resistor pattern R is formed to be thinner than the cell gate electrode WL to prevent a silicide layer from being formed on the resistor pattern R, top surfaces of the resistor pattern R and the cell gate electrode WL formed on the protruded device isolation layer STI2 may be located at the same distance from a top surface of the semiconductor substrate 100. In other words, since a vertical location of bottom surface of the resistor pattern R is variable, although a thickness of the resistor pattern R is formed to be smaller than a thickness of the cell gate electrode WL, a height difference may not exist between a top surface of the cell gate electrode WL and a top surface of the resistor pattern R. Thus, as will be described with reference to FIG. 14, when the silicide layer 180 is formed on a top surface of the cell gate electrode WL, the silicide layer 180 may be formed also on a top surface of the resistor pattern R.

In embodiments of the inventive concept, since the resistor pattern is spaced apart from the device isolation layer STI2 to be formed on the second active region 102, it may be prevented that a distance from a top surface of the semiconductor substrate 100 to a bottom surface of the resistor pattern R becomes different depending on a vertical thickness of the device isolation layer STI2.

Also, in the second active region 102, a portion of the semiconductor substrate 100 of both sides of the resistor patterns R may have a recessed structure. For example, a top surface of the semiconductor substrate 100 of both sides of the resistor patterns R may be located to be lower than a top surface of the semiconductor substrate 100 of both sides of the cell gate electrode WL. Even though the semiconductor substrate 100 of both sides of the resistor pattern R is recessed, a top surface of the semiconductor substrate 100 under the resistor pattern R and a top surface of the semiconductor substrate 100 under the cell gate electrode WL are located at the substantially same vertical height.

The high voltage gate insulating layer 113 is interposed between the third active region 103 and the high voltage gate electrode HVG and may have the same laminated structure as the cell gate electrode WL.

For example, the high voltage gate insulating layer 113 on the third active region 103 has a thickness enough to endure a high operation voltage applied to a high voltage transistor. The high voltage gate insulating layer 113 is formed to be thicker than the tunnel insulating layer 111 of the first active region 101 and the select gate insulating layer 111. Also, although not illustrated in the drawing, in the case that a low voltage transistor is disposed on the third active region 103, a low voltage gate insulating layer having a thickness appropriate for an operation characteristic of a low voltage transistor may be formed.

The silicide layer 180 having the same material and thickness as the silicide layer 180 formed on the top layer of the cell gate electrode WL is disposed on a top surface of the high voltage gate electrode HVG. The high voltage gate electrode HVG may include the lower gate conductive pattern 123 and upper gate conductive patterns 143 and 153. The lower gate conductive pattern 123 of the high voltage gate electrode HVG is formed of the same material as the first gate conductive pattern 121 of the cell gate electrode WL. A top surface of the lower gate conductive pattern 123 may be located on the same plane as the top surface of the first gate conductive pattern 121. Also, the upper gate conductive patterns 143 and 153 of the high voltage gate electrode HVG are formed of the same material and thickness as the control gate electrode CG of the cell gate electrode WL. That is, the upper gate conductive patterns 143 and 153 may be constituted by second and third gate conductive patterns 141 and 151.

Also, in the high voltage gate electrode HVG, a residual insulating pattern 133 having the substantially same material and thickness as the intergate insulating layer 131 of the cell gate electrode WL may be interposed between the lower gate conductive pattern 123 and upper gate conductive patterns 143 and 153, similar to the select gate electrode SSL and GSL. A portion of the upper gate conductive pattern 153 penetrates upper gate conductive pattern 143 and the residual insulating pattern 133 to directly contact the lower gate conductive pattern 123, thereby electrically connecting the lower gate conductive pattern 123 and upper gate conductive patterns 143 and 153 to one another.

Also, a silicide layer 180 having the same material and thickness as the silicide layer 180 formed on the top layer of the cell gate electrode WL is disposed on a top surface of the upper gate conductive patterns 143 and 153. Also, an interlayer insulating layer 170 exposing top surfaces of the gate electrodes WL, SSL/GSL and HVG and covering the resistor pattern R is disposed on the semiconductor substrate 100. An etching stop layer 163 may be formed between the interlayer insulating layer 170 and the resistor pattern R. Also, an upper interlayer insulating layer 190 covering the silicide layer 180 may be disposed on the interlayer insulating layer 170.

Figure 3:
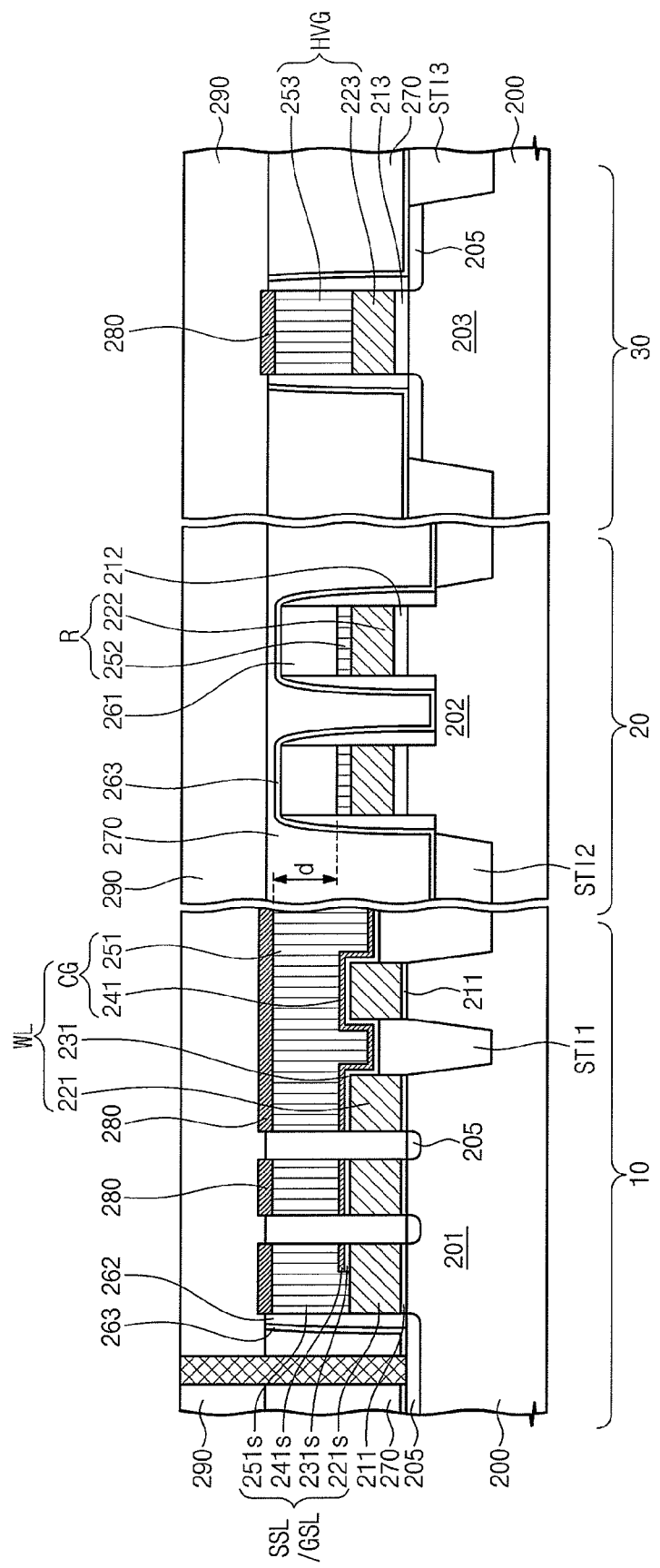
FIG. 3 is a cross sectional view of a semiconductor memory device in accordance with an exemplary embodiment of the inventive concept, which is taken along the line I-I' of FIG. 1.

FIG. 3 is a cross sectional view of a semiconductor memory device in accordance with another embodiment of the inventive concept, which is taken along the line I-I' of FIG. 1. FIG.

4 illustrates a modified example of a semiconductor memory device in accordance with another embodiment of the inventive concept.

Referring to FIGS. 1 and 3, as described with reference to FIG. 2, a semiconductor substrate 200 includes a cell array region 10, a resistor region 20 and a peripheral circuit region 30. On the cell array region 10, cell gate electrode WL, a string select gate electrode SSL and a ground select gate electrode GSL are disposed to cross a first active region 201. A resistor pattern R is disposed on a second active region 202. On the peripheral circuit region 30, a low voltage gate electrode (not illustrated) and a high voltage gate electrode HVG are disposed to cross a third active region 203. Also, a silicide layer 280 is disposed on the top layer of the gate electrodes WL, SSL/GSL and HVG except the resistor pattern R.

The cell gate electrode WL includes a floating gate electrode 221, an intergate insulating pattern 231, a control gate electrode CG and the silicide layer 280 that are sequentially stacked. A tunnel insulating layer 211 is interposed between the first active region 201 and the cell gate electrode WL.

According to the present embodiment, the control gate electrode CG of the cell gate electrode WL may include a protection conductive pattern 241 and a control gate conductive pattern 251.

The protection conductive pattern 241 directly contacting a top surface of the intergate insulating layer 231 may be formed from, for example, a polysilicon layer doped with an impurity or may be formed of conductive material having a high work function compared with a polysilicon layer doped with an impurity. For example, conductive material having a high work function may be formed from at least one selected from the group consisting of a metal layer such as tungsten or molybdenum, a conductive metal nitride layer such as a titanium nitride layer, a tantalum nitride layer, a tungsten nitride layer and a titanium aluminum nitride layer and metal silicide such as tungsten silicide.

The select gate electrode SSL and GSL may include a lower select gate pattern 221s formed of the same material as the floating gate electrode 221 and an upper select gate pattern 251s formed of the same material as control gate conductive pattern 251 of the control gate electrode CG. The upper select gate pattern 251s may contact an entire portion of a top surface of the lower select gate pattern 221s. Also, in the select gate electrode SSL and GSL, as described in FIG. 2, a portion of an intergate conductive insulating layer 231s and a protection conductive pattern 241s may be interposed between the lower gate conductive pattern 221s and the upper gate conductive pattern 251s. A thickness of the lower select gate pattern 221s may be different from a thickness of the floating gate electrode 221 and a thickness of the upper select gate pattern 251s may also be different from a thickness of the control gate conductive pattern 251.

Also, the high voltage gate electrode HVG may have the substantially same structure as the select gate electrode SSL and GSL. The silicide layer 280 may be disposed on the top layer of the select gate electrode SSL and GSL and the high voltage gate electrode HVG.

The resistor pattern R may include a lower resistor pattern 222 and an upper resistor pattern 252. The lower resistor pattern 222 is formed of the same material as the floating gate electrode 221 and a thickness of the lower resistor pattern 222 may be equal to or smaller than a thickness of the floating gate electrode 221. The upper resistor pattern 252 is formed of the same material as the control gate electrode CG and a thickness of the upper resistor pattern 252 is smaller than a thickness of the control gate electrode CG. According to the present embodiment, a resistance of the resistor pattern R may be determined according to a thickness of the upper resistor pattern 252 formed on the lower resistor pattern 222.

Figure 4:
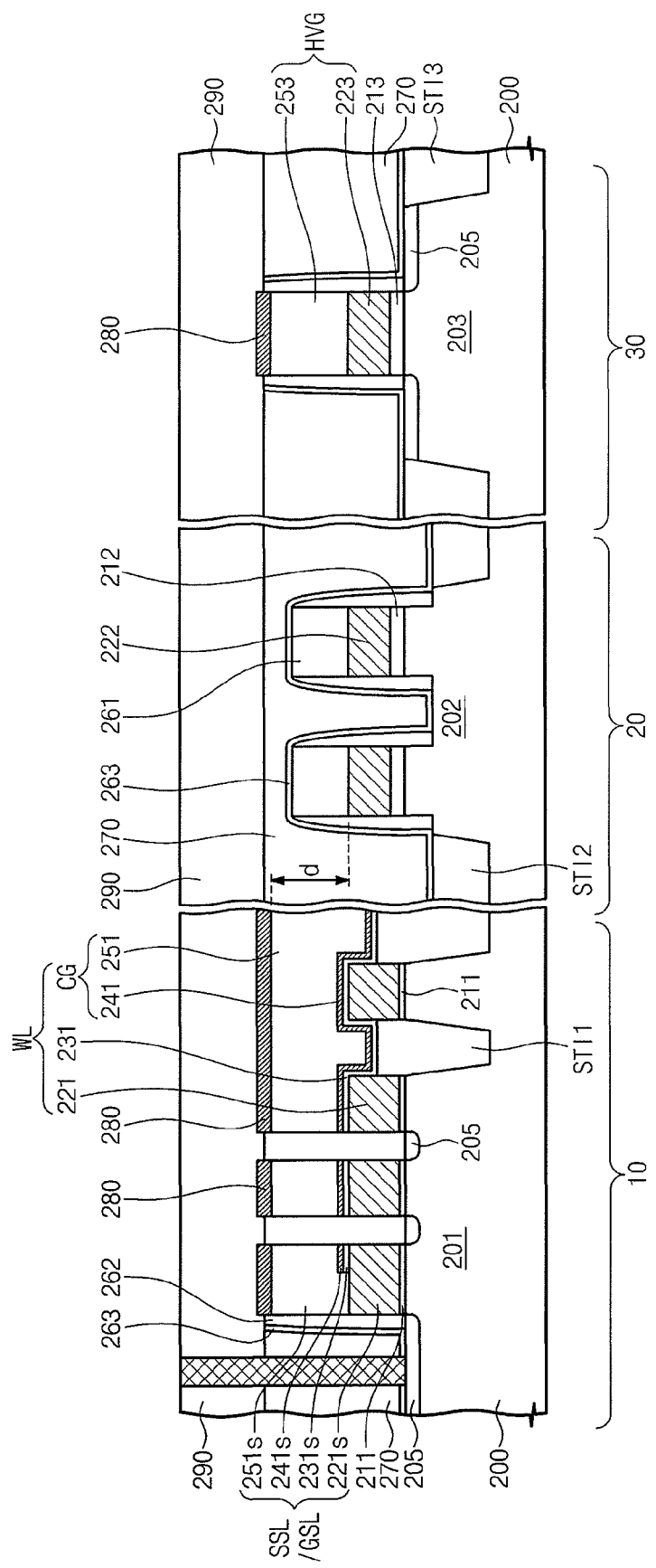
FIG. 4 illustrates a modified example of a semiconductor memory device in accordance with an exemplary embodiment of the inventive concept.

According to another embodiment, as described in FIG. 4, the resistor pattern R may be formed by the lower resistor pattern 222, that is, a single layer.

Also, in this embodiment, a height difference between the resistor pattern R and the cell gate electrode WL may exist. That is, a top surface of the resistor pattern R may be located to be lower than a top surface of the cell gate electrode WL. The silicide layer 280 may be formed on top surfaces of the gate electrodes WL, SSL/GSL and HVG.

FIGS. 5 through 14 are cross sectional views for illustrating a method of manufacturing a semiconductor memory device in accordance with an embodiment of the inventive concept.

Figure 5:
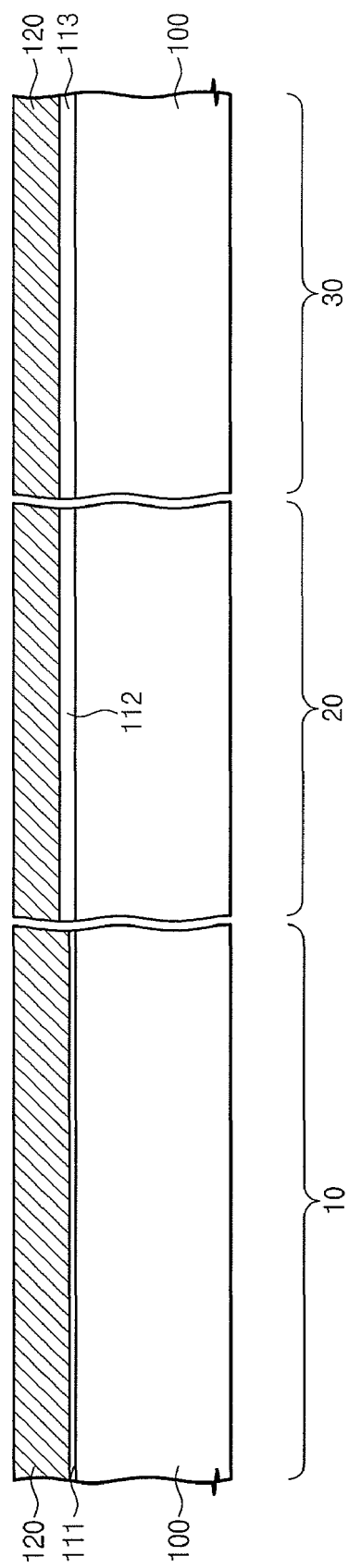
FIGS. 5 through 14 are cross sectional views for illustrating a method of manufacturing a semiconductor memory device in accordance with an exemplary embodiment of the inventive concept.

Referring to FIG. 5, a tunneling insulating layer 111 is formed on a cell array region 10, a buffer insulating layer 112 is formed on a resistor region 20 and a gate insulating layer 113 is formed on a peripheral circuit region 30. The tunnel insulating layer 111 and the gate insulating layer 113 may be formed to have different thicknesses from each other. Also, the gate insulating layer 113 may have different thicknesses at a region where a low voltage transistor is formed and at a region where a high voltage transistor is formed, respectively.

According to an embodiment, after forming the tunnel insulating layer 111 on an entire surface of a semiconductor substrate 100 and forming a mask pattern covering the cell array region 10, a process of forming a gate insulating layer is additionally performed on the peripheral circuit region 30 to form the gate insulating layer 113 on the peripheral circuit region 30. Also, the tunnel insulating layer 111 and the gate insulating layer 113 having different thicknesses from each other may be formed using a different method.

Also, the buffer insulating layer 112 of the resistor region 20 and the gate insulating layer 113 of the peripheral circuit region 30 may be formed at the same time and may have the same thickness. According to another embodiment, the buffer insulating layer 112 of the resistor region 20 and the tunnel insulating layer 111 of the cell array region 10 may be formed at the same time and may have the same thickness.

The tunnel insulating layer 111, the buffer insulating layer 112 and the gate insulating layer 113 may be formed from a thermal oxidation layer, for example, using a thermal oxidation process. Also, the tunnel insulating layer 111, the buffer insulating layer 112 and the gate insulating layer 113 may be formed of a high dielectric material such as, for example, $Al_2O_3$, $HfO_2$, $ZrO_2$, $La_2O_3$, $Ta_2O_3$, $TiO_2$, $SrTiO_3$(STO), (Ba, Sr)$TiO_3$(BST) or a complex layer stacked by combinations thereof. The tunnel insulating layer 111, the buffer insulating layer 112 and the gate insulating layer 113 may be formed using, for example, a chemical vapor deposition (CVD) process or an atomic layer deposition (ALD) process.

A first gate conductive layer 120 is formed on the tunnel insulating layer 111, the buffer insulating layer 112 and the gate insulating layer 113.

For example, first gate conductive layer 120 may be formed by depositing a polysilicon layer or a metal layer on the tunnel insulating layer 111 and may be doped with a dopant such as phosphorous (P) or boron (B) during a deposition of a polysilicon layer.

Figure 6:
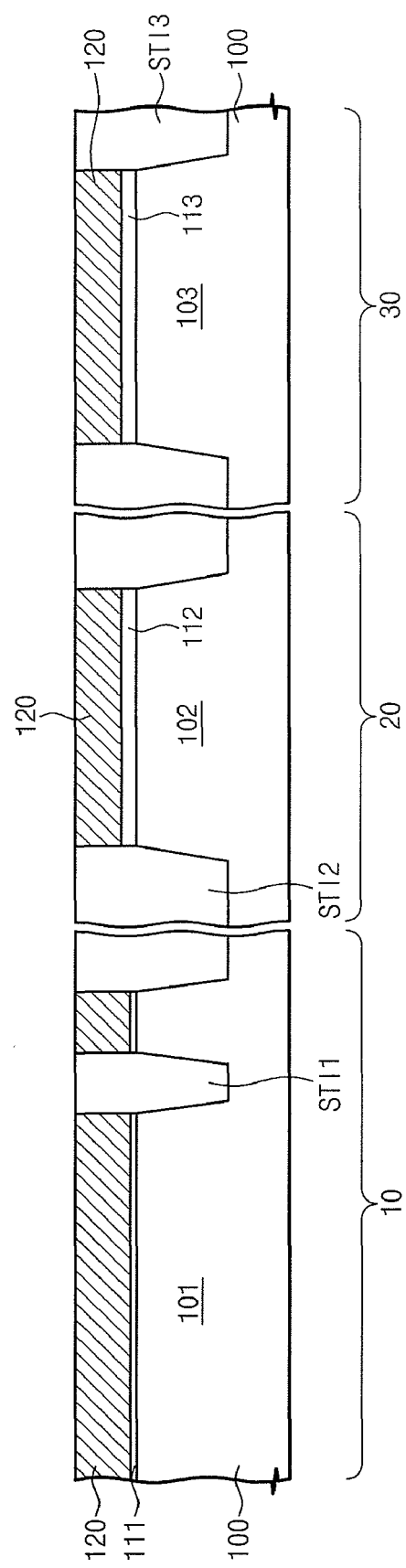

Referring to FIG. 6, device isolation layers STI1 through STI3 defining first through third active regions 101 through 103 are formed in the semiconductor substrate 100.

For example, a mask pattern (not illustration) is formed on the first gate layer 120 and a trench defining an active region is formed in the semiconductor substrate 100 using the mask pattern as an etching mask. The trench may have a sidewall profile that has a gradually narrowing width as approaching a lower portion of the trench by a characteristic of an anisotropic etching process. After that, the device isolation layers STI1 through STI3 may be formed by filling the trench with an insulating material. The device isolation layers STI1 through STI3 may be formed from one of, for example, a boron-phosphor silicate glass (BPSG) layer, a high density plasma (HDP) oxide layer, an $O_3$-TEOS layer and a USG layer. Also, the mask pattern may be removed after forming the device isolation layers STI1 through STI3.

Figure 7:
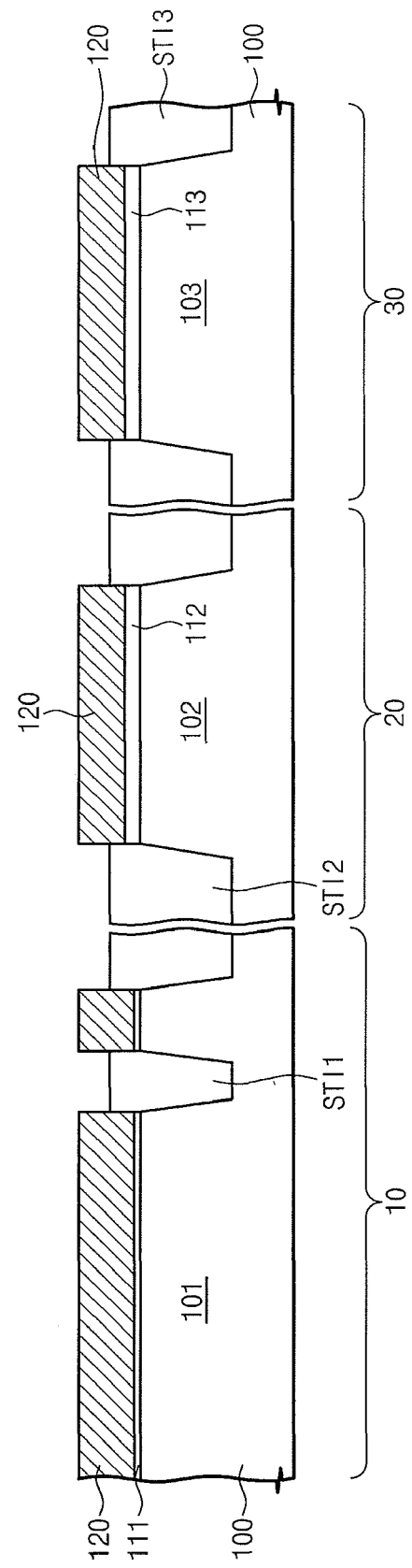

Referring to FIG. 7, when a subsequent process (for example, a thermal oxidation process) is performed, upper portions of the device isolation layers STI1 through STI3 are recessed so that the tunnel insulating layer 111 and the gate insulating layer 113 are not exposed. As the device isolation layers STI1 through STI3 are recessed, a portion of sidewall of the first gate conductive layer 120 may be exposed. At this time, since a thickness of the tunnel insulating layer 111 is different from a thickness of the gate insulating layer 113, a recess depth of the device isolation layers STI1 through STI3 may be different in the cell array region 10 and in the peripheral circuit region 30.

According to an embodiment, a mask pattern covering the resistor region 20 and the peripheral circuit region 30 is formed, and then a process recessing the device isolation layer STI1 of the cell array region 10 may be performed. After that, the mask pattern is removed, and then a process recessing the device isolation layers STI1 through STI3 may be performed in the cell array region 10, the resistor region 20 and the peripheral circuit region 30. In this case, a vertical thickness of the device isolation layer STI1 in the cell array region 10 may be different from vertical thicknesses of the device isolation layers STI2 and STI3 in the resistor region 20 and the peripheral circuit region 30. That is, a top surface of the device isolation layer STI1 in the cell array region 10 may be located to be lower than top surfaces of the device isolation layers STI2 and STI3 in the resistor region 20 and the peripheral circuit region 30.

Figure 8:
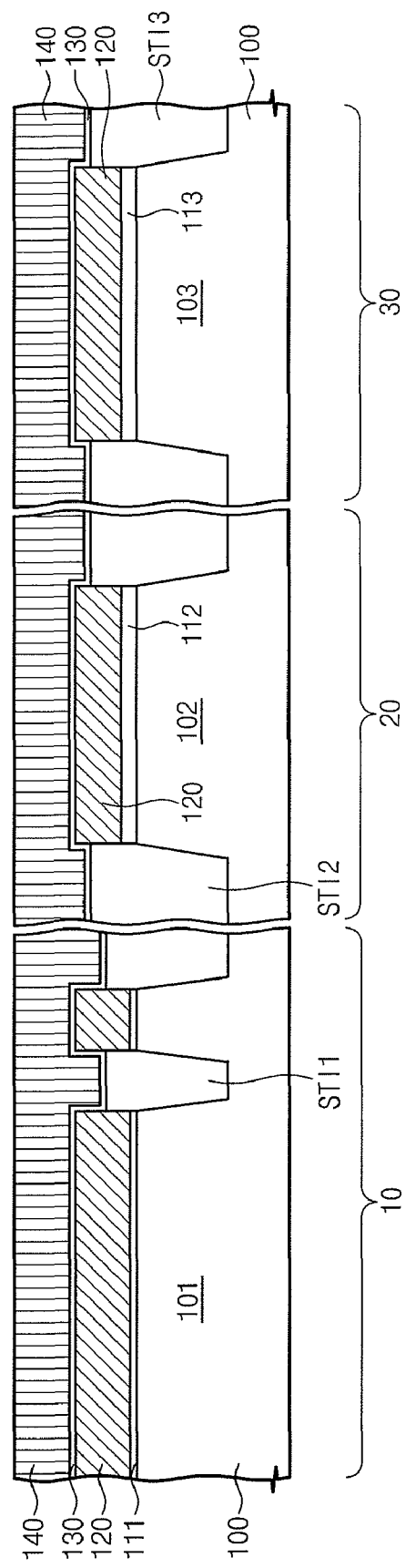

Referring to FIG. 8, an intergate insulating layer 130 and a second gate conductive layer 140 are sequentially formed on the first gate conductive layer 120. The intergate insulating layer 130 can conformally cover top surfaces of the first gate conductive layer 120 and the device isolation layers STI1 through STI3.

The intergate insulating layer 130 may include at least one of, for example, a silicon oxide layer, a silicon nitride layer and a silicon oxynitride layer. The intergate insulating layer 130 may also be formed by sequentially stacking, for example, a silicon oxide layer, a silicon nitride layer and a silicon oxynitride layer. The intergate insulating layer 130 may also be formed of a high dielectric material such as, for example, $Al_2O_3$, $HfO_2$, $ZrO_2$, $La_2O_3$, $Ta_2O_3$, $TiO_2$, $SrTiO_3$ (STO), $(Ba,Sr)TiO_3$(BST) or a complex layer stacked by combinations thereof.

The second gate conductive layer 140 may be formed by, for example, depositing polysilicon doped with an impurity or a metal layer. The metal layer may be formed from at least one selected from the group consisting of a metal layer such as, for example, tungsten or molybdenum, a conductive metal nitride layer such as a titanium nitride layer, a tantalum nitride layer, a tungsten nitride layer or a titanium aluminum nitride layer, and a metal silicide layer.

Figure 9:
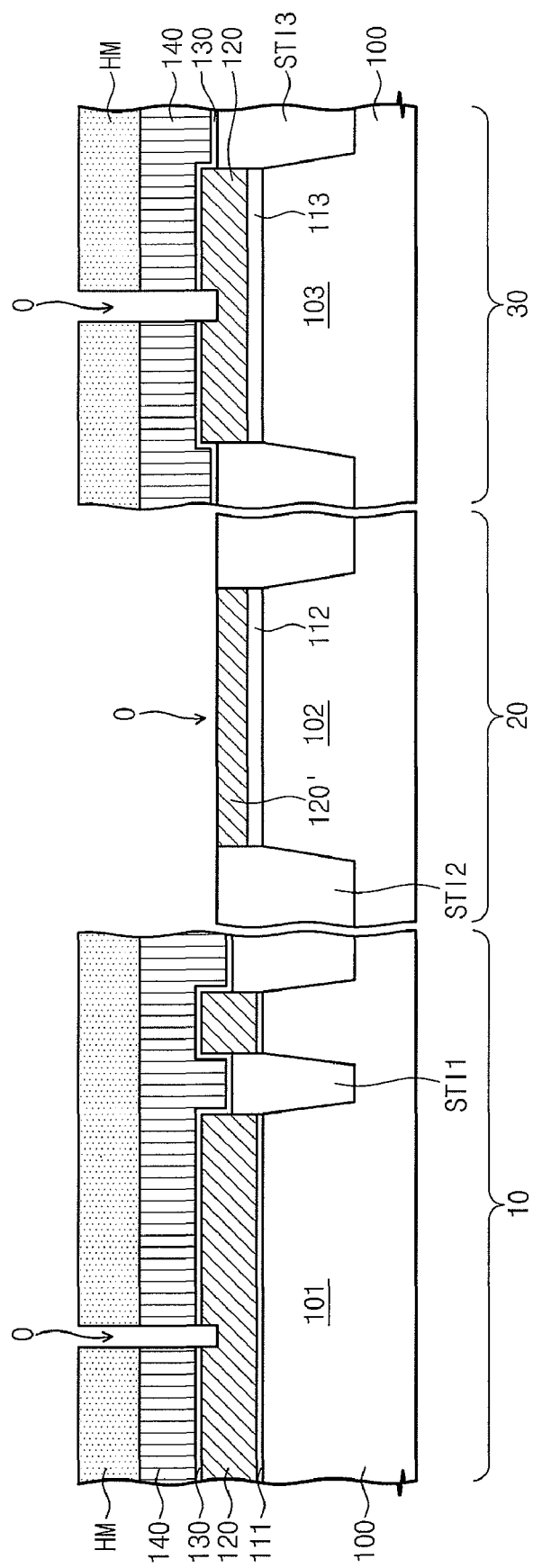

Referring to FIG. 9, the intergate insulating layer 130 and the second gate conductive layer 140 in the resistor region 20 are removed.

For example, a mask pattern HM exposing the second gate conductive layer 140 of the resistor region 20 is formed. At the same time, the mask pattern HM exposes a portion of the second gate conductive layer 140 where a select gate electrode (SSL/GSL in FIG. 2) of the first active region 101 and a high voltage gate electrode (HVG in FIG. 2) of the third active region 103 are formed.

The second gate conductive layer 140 and the intergate insulating layer 130 are anisotropically etched using the mask pattern HM. As a result, an opening O exposing the first gate conductive layer 120 may be formed on the resistor region 20. Also, openings O exposing the first gate conductive layer 120 may be locally formed on the first and third active regions 101 and 103.

Also, during the anisotropic etching process, a portion of the first gate conductive layer 120 on the resistor region 20 exposed by the opening O may be etched. Accordingly, a thickness of the first gate conductive layer 120 in the resistor region 20 may be reduced. That is, a thickness of the first gate conductive layer 120 in the resistor region 20 can be selectively controlled. Also, since the anisotropic etching process is concurrently performed in the cell array region 10, the resistor region 20 and the peripheral circuit region 30, a portion of the first gate conductive layer 120 exposed by the openings O of the first and third active regions 101 and 103 may be etched.

Figure 10:
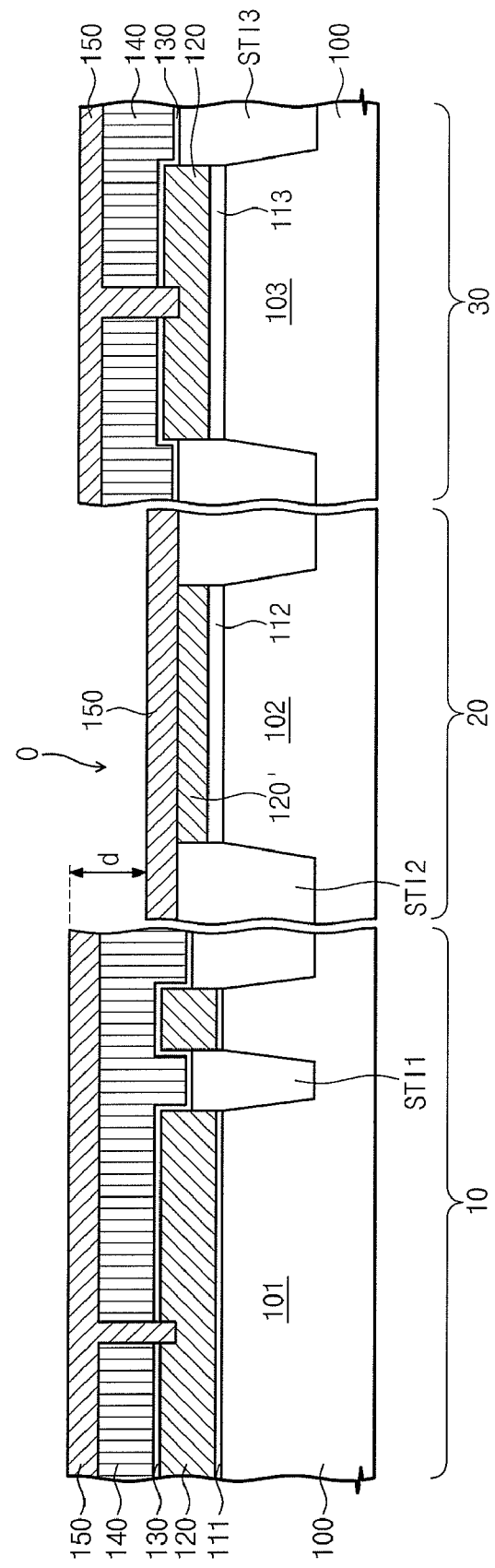

Referring to FIG. 10, a third gate conductive layer 150 is conformally formed on the cell array region 10, the resistor region 20 and the peripheral circuit region 30.

The third gate conductive layer 150 may be formed by, for example, conformally depositing a polysilicon layer doped with an impurity. The third gate conductive layer 150 can directly contact the first gate conductive layer 120 on the resistor region 120 and a resistance of the resistor pattern R can be determined according to a thickness of the third gate conductive layer 150. In the cell array region 10 and the peripheral circuit region 30, the third gate conductive layer 150 may be formed on the second gate conductive layer 140 while filling the openings O.

Since the second gate conductive layer 140 is removed on the resistor region 20, the third gate conductive layer 150 may have a step difference (d) between the resistor region 20 and the cell array region 10. That is, a top surface of the third gate conductive layer 150 in the resistor region 20 is located to be lower than a top surface of the third gate conductive layer 150 in the cell array region 10.

Figure 11:
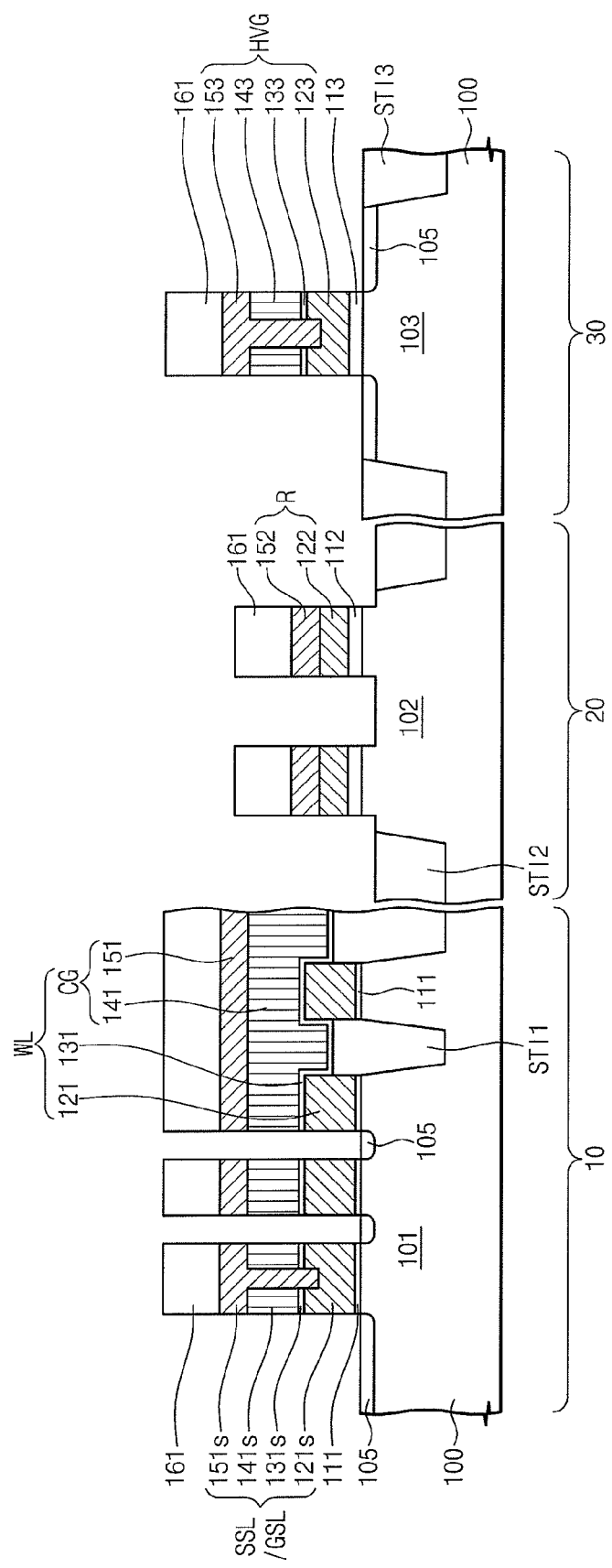

Referring to FIG. 11, the layers stacked on the semiconductor substrate 100 are patterned to form cell gate electrodes WL and select gate electrodes SSL and GSL on the first active region 101, a resistor pattern R on the second active region 102 and a high voltage gate electrode HVG on the third active region 103.

For example, hard mask patterns 161 are formed on the layers stacked on the semiconductor substrate 100 and the stacked layers are anisotropically etched using the hard mask patterns 161.

The intergate insulating layer 130 and the second and third gate conductive layers 140 and 150 on the cell array region 10 are etched to form an intergate insulating pattern 131 and second and third gate conductive patterns 141 and 151 crossing the first active region 101. The first gate conductive layer 120 formed between the device isolation layers STI1 in the cell array region 10 is etched to form first gate conductive patterns 121. That is, the cell gate electrode may include the first gate conductive pattern 121, the intergate insulating pattern 131 and second and third gate conductive patterns 141 and 151.

The select gate electrodes SSL and GSL are formed on a portion of the cell array region 10 including the opening O.

Since the select gate electrode SSL and GSL and the cell gate electrode WL are formed at the same time, the select gate electrode SSL and GSL may include a lower gate conductive pattern 121s, a residual insulating pattern 131s and upper gate conductive patterns 141s and 151s, and the upper gate conductive pattern 151s can directly contact the lower gate conductive pattern 121s.

The high voltage gate electrode HVG may be formed on the peripheral circuit region 30 in a manner similar to the select gate electrode SSL and GSL. That is, the high voltage gate electrode HVG may include lower gate conductive pattern 123 and upper gate conductive patterns 143 and 153 and a residual insulating pattern 133, and the upper gate conductive patterns 143 and 153 can directly contact the lower gate conductive pattern 123.

In the resistor region 20, the first gate conductive layer 120 and the third gate conductive layer 150 are anisotropically etched to form a lower resistor pattern 122 and an upper resistor pattern 152.

According to an embodiment, since a height of a laminated structure stacked on the resistor region 20 in the semiconductor substrate 100 is low, when the gate electrodes WL, SSL/GSL and HVG and the resistor pattern R are formed at the same time, the semiconductor substrate 100 and the device isolation layer STI2 on both sides of the resistor pattern R may be recessed. Accordingly, a top surface of the semiconductor substrate 100 adjacent to the resistor pattern R may be more deeply recessed than a top surface of the semiconductor substrate 100 adjacent to the cell gate electrode WL.

Although the semiconductor substrate 100 on both sides of the resistor pattern R in the resistor region 20 is recessed, a top surface of the semiconductor substrate 100 contacting the buffer insulating layer 112 is even with a top surface of the semiconductor substrate 100 contacting the tunnel insulating layer 111. Therefore, a distance from a surface of the semiconductor substrate 100 under the resistor pattern R to a top surface of the resistor pattern R may be uniformly maintained.

After forming the gate electrodes WL, SSL/GSL and HVG, source/drain regions 105 may be formed in active regions 101 and 103 on both sides of the gate electrodes WL, SSL/GSL and HVG.

Figure 12:
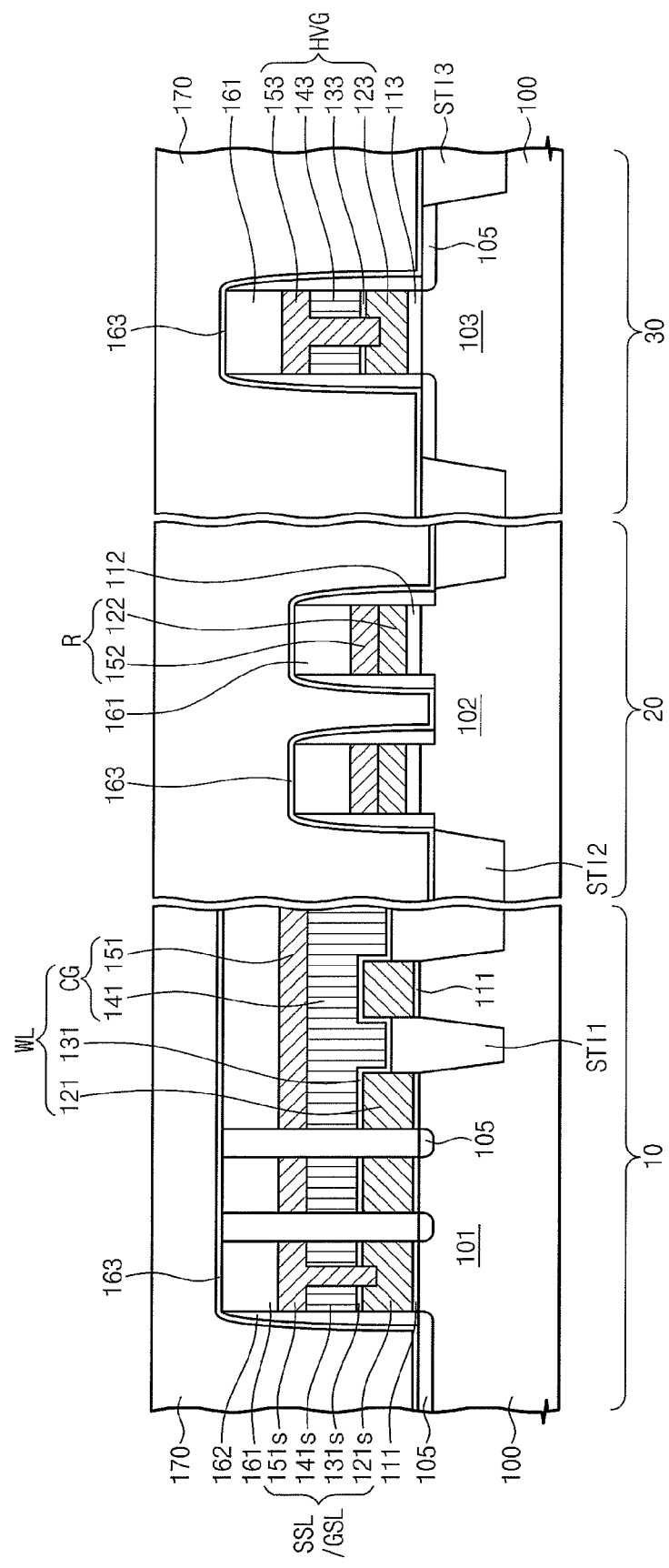

Referring to FIG. 12, a spacer 162 covering sidewalls of the gate electrodes WL, SSL/GSL and HVG and the resistor pattern R is formed and an interlayer insulating layer 170 covering the gate electrodes WL, SSL/GSL and HVG and the resistor pattern R is formed.

According to an embodiment, before forming the interlayer insulating layer 170, an etching stop layer 163 conformally covering the gate electrodes WL, SSL/GSL and HVG and the resistor pattern R may be formed, which include the spacer 162 on sidewalls thereof.

For example, the spacer 162 and the etching stop layer 163 may be formed from a silicon nitride layer or a silicon oxynitride layer and the interlayer insulating layer 170 may be formed by depositing an insulating layer having a superior step difference coating characteristic such as a boron-phosphor silicate glass (BPSG) layer, a high density plasma (HDP) oxide layer, an $O_3$-TEOS layer and a USG layer.

Figure 13:
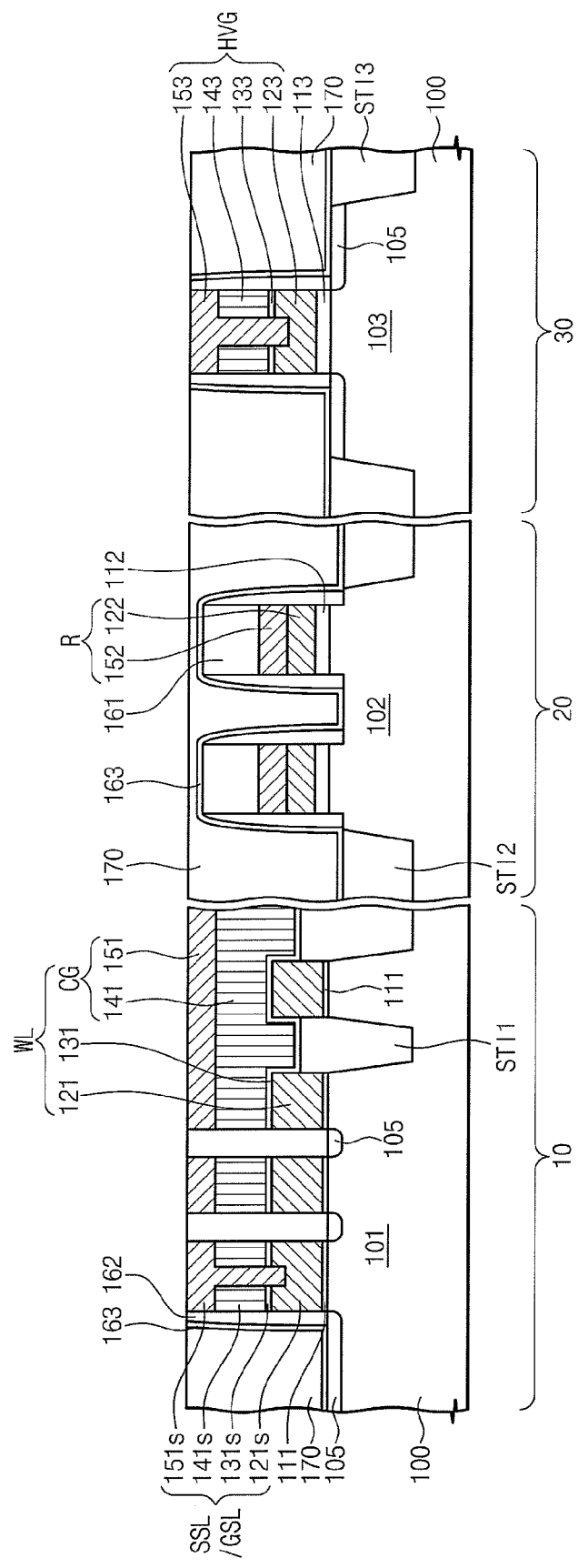

Referring to FIG. 13, top surfaces of the gate electrodes WL, SSL/GSL and HVG of the cell array region 10 and the peripheral circuit region 30 are exposed.

For example, the interlayer insulating layer 170 can be anisotropically etched so that top surfaces of the third gate conductive patterns 151, 151s and 153 of the gate electrodes WL, SSL/GSL and HVG are exposed. The hard mask pattern 161 on the interlayer insulating layer 170 and the gate electrodes WL, SSL/GSL and HVG can be removed until top surfaces of the gate electrodes WL, SSL/GSL and HVG of the cell array region 10 and the peripheral circuit region 30 are exposed. At this time, since the upper resistor pattern 152 of the resistor region 20 and the third gate conductive pattern 151 of the cell array region 10 have a height difference, the upper resistor pattern 152 of the resistor region 20 is not exposed.

Figure 14:
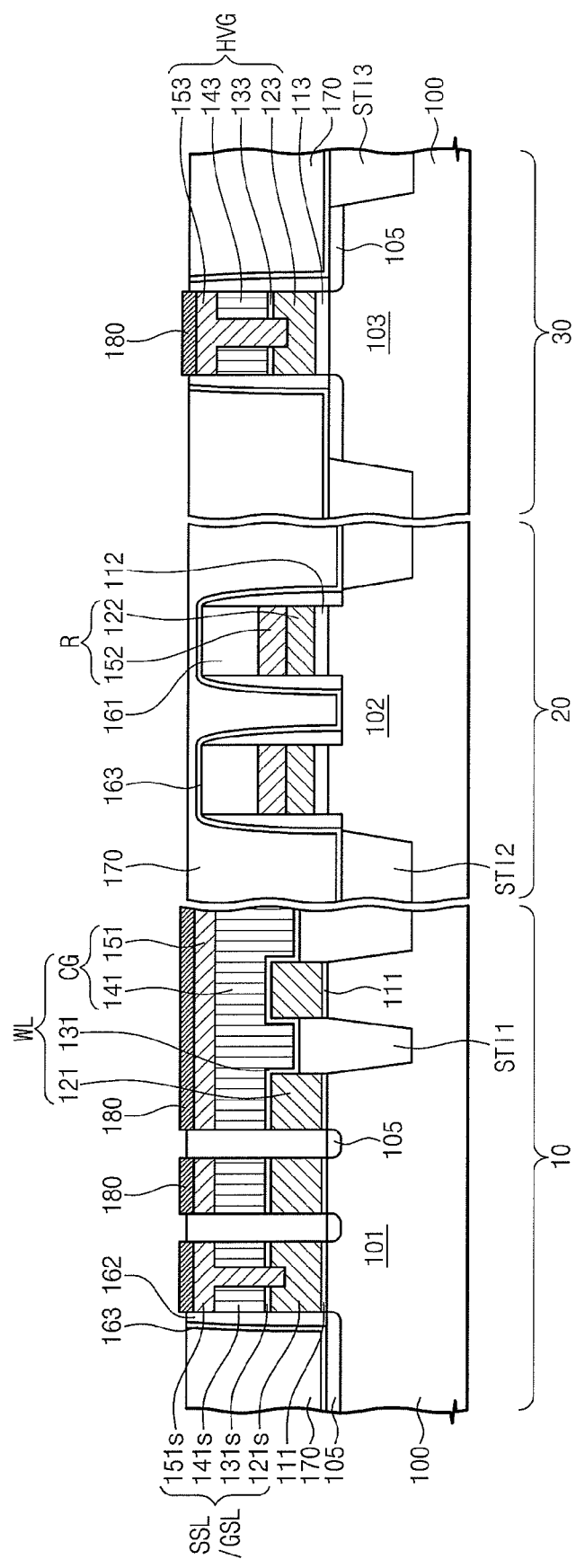

Referring to FIG. 14, a silicide layer 180 is formed on a top surface of the gate electrodes WL, SSL/GSL and HVG of the cell array region 10 and the peripheral circuit region 30.

For example, a metal layer (not illustrated) is formed on the interlayer insulating layer 170 exposing a top surface of the gate electrodes WL, SSL/GSL and HVG of the cell array region 10 and the peripheral circuit region 30. The metal layer may be formed of metal material such as, for example, cobalt (Co), nickel (Ni), tungsten (W), molybdenum (Mo) or titanium (Ti). Subsequently, a thermal process is performed to apply a silicidation process that the metal layer reacts to the third gate conductive pattern 151 formed of, for example, a polysilicon layer. The silicide layer 180 may be formed on top surfaces of the gate electrodes WL, SSL/GSL and HVG of the cell array region 10 and the peripheral circuit region 30 by the silicidation process.

After the silicidation process, a wet etching process is performed to remove a metal layer which does not react to silicon. For example, a mixture solution of Sulfuric acid ($H_2SO_4$) and hydrogen peroxide ($H_2O_2$) may be used as an etching solution when a wet etching process is performed.

Like this, since a top surface of the resistor pattern R is not exposed when a silicidation process is performed, the silicide layer 180 may be prevented from being formed on the resistor pattern R.

After that, as illustrated in FIG. 2, an upper interlayer insulating layer 190 covering the silicide layer 180 may be formed.

FIGS. 15 through 22 are cross sectional views for illustrating a method of manufacturing a semiconductor memory device in accordance with another embodiment of the inventive concept.

Figure 15:
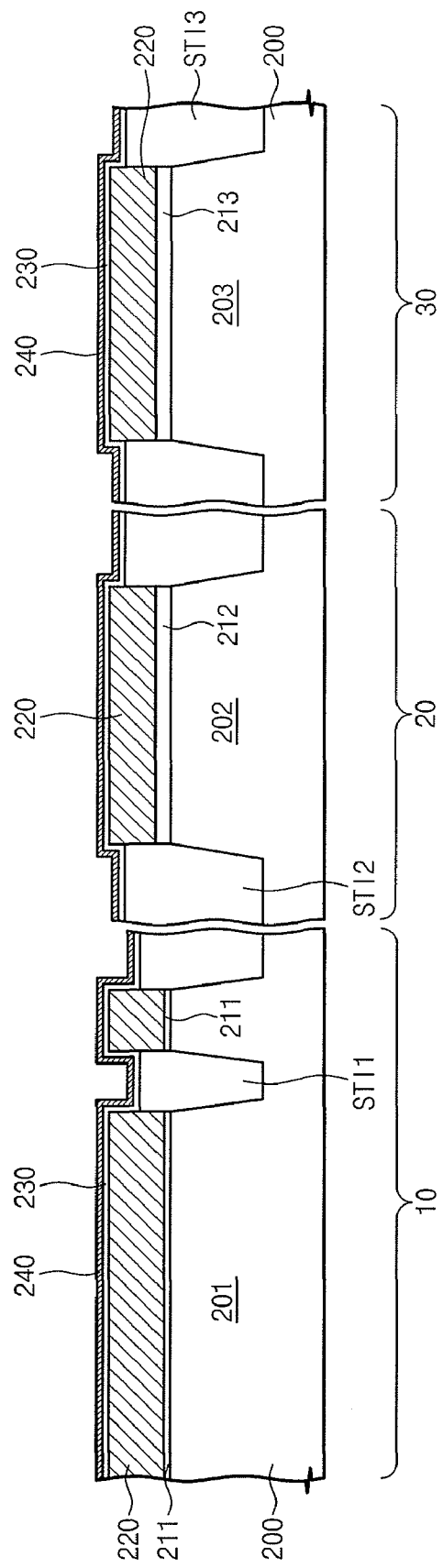
FIGS. 15 through 22 are cross sectional views for illustrating a method of manufacturing a semiconductor memory device in accordance with an exemplary embodiment of the inventive concept.

According to another embodiment, as described with reference to FIGS. 5 and 6, after forming a tunnel insulating layer 211, a buffer insulating layer 212, a gate insulating layer 213, a floating gate conductive layer 220 and device isolation layers STI1 through STI3, an intergate insulating layer 230 and a protection conductive layer 240 are formed as illustrated in FIG. 15. A thickness of the protection conductive layer 240 can be selectively controlled.

The intergate insulating layer 230 may include at least one of, for example, a silicon oxide layer, a silicon nitride layer and a silicon oxynitride layer. The intergate insulating layer 230 may be formed by, for example, sequentially stacking a silicon oxide layer, a silicon nitride layer and a silicon oxynitride layer. Also, the intergate insulating layer 230 may be formed of a high dielectric material such as, for example, $Al_2O_3$, $HfO_2$, $ZrO_2$, $La_2O_3$, $Ta_2O_3$, $TiO_2$, $SrTiO_3$(STO), (Ba, Sr)$TiO_3$(BST) or a complex layer stacked by combinations thereof.

The protection conductive layer 240 may be formed from, for example, a polysilicon layer doped with an impurity. The protection conductive layer 240 may be formed of a conductive material having a work function higher than the polysilicon layer doped with an impurity. For example, the protection conductive layer 240 may be formed of a conductive metal nitride layer such as a tungsten nitride layer (WN), a tantalum nitride layer (TiN) or a titanium nitride layer (TaN).

The protection conductive layer 240 protects the intergate insulating layer 230 and can reduce resistances of gate electrodes. In the case that the protection conductive layer 240 is formed of a conductive material having a high work function, the protection conductive layer 240 can suppress phenomenon such that charges stored in a floating gate electrode are back-tunneled to a control gate electrode through the intergate insulating layer 230.

Figure 16:
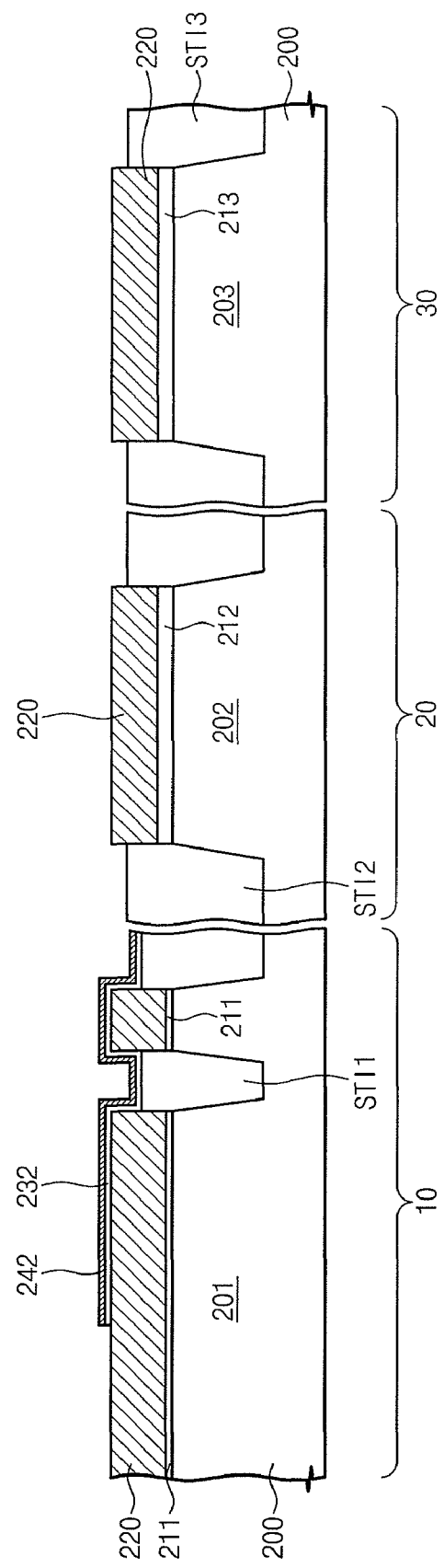

Referring to FIG. 16, the protection conductive layer 240 is patterned to form an intergate insulating pattern 232 and a protection conductive pattern 242 on a cell array region 10.

The intergate insulating pattern 232 and the protection conductive pattern 242 can be locally formed in a region where a cell gate electrode (WL of FIG. 4) is to be formed and expose the floating gate conductive layer 220 of a resistor region 20 and a peripheral circuit region 30.

Figure 17:
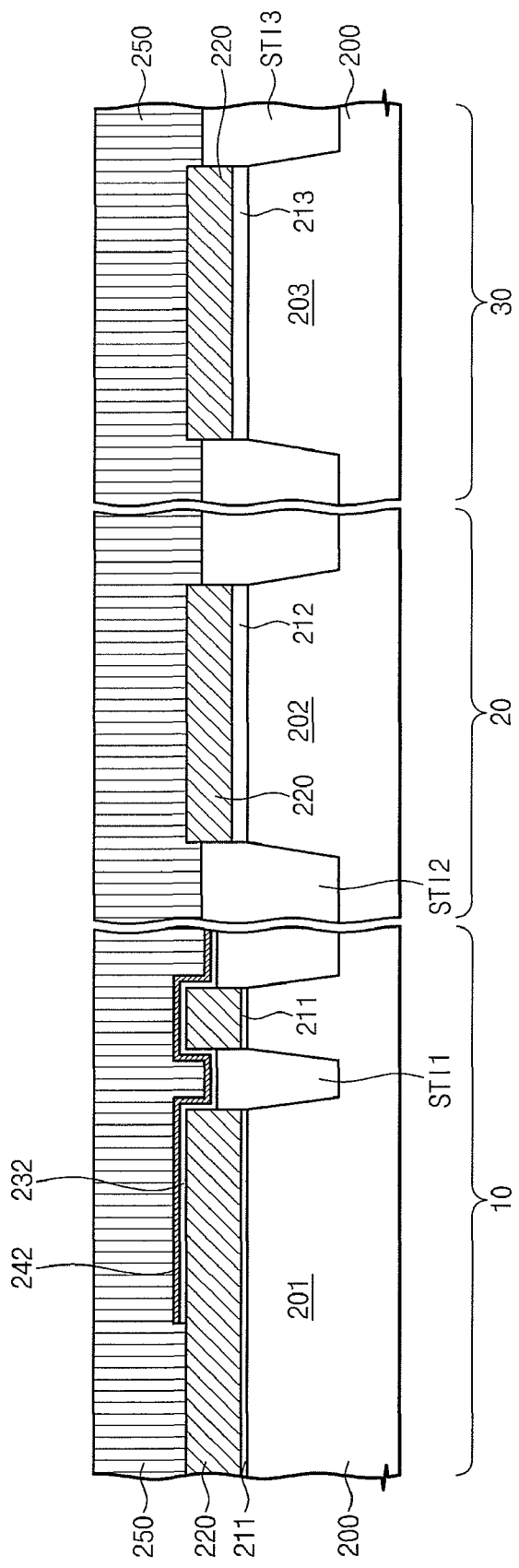

Referring to FIG. 17, a control gate conductive layer 250 is formed on the floating gate conductive layer 220 and the protection conductive pattern 242.

The control gate conductive layer 250 may be formed by, for example, depositing a polysilicon layer doped with an impurity. The control gate conductive layer 250 can directly contact the floating gate conductive layer 220 on the resistor region 20 and the peripheral circuit region 30. Also, a top surface of the control gate conductive layer 250 is planarized, so on the cell array region 10, the resistor region 20 and the peripheral circuit region 30, heights from a surface of a semiconductor substrate 200 to top surfaces of the control gate conductive layer 250 may be subsequently equal.

Figure 18:
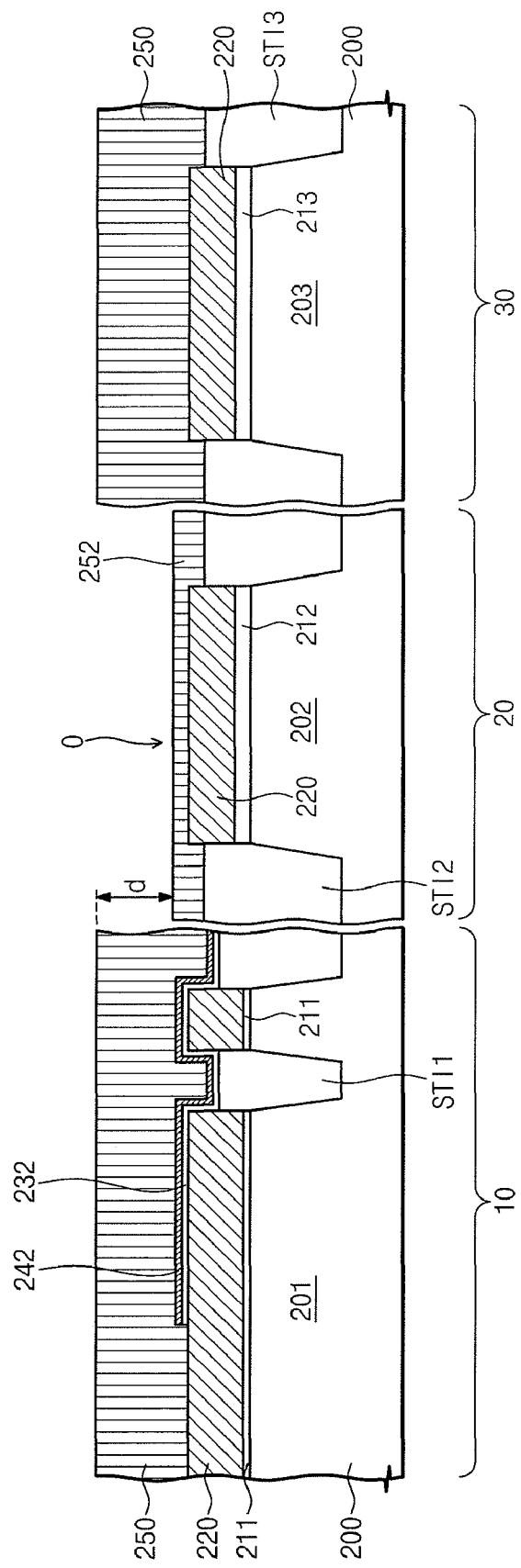

Referring to FIG. 18, a portion of the control gate conductive layer 250 is etched to reduce a thickness of the control gate conductive layer 250 on the resistor region 20. As a result, an opening O may be formed on the control gate conductive layer 250 of the resistor region 20. Thus, a step difference d between a top surface of the control gate conductive layer 250 on the cell array region 10 and a top surface of a control gate conductive layer 252 on the resistor region 20 may exist. When forming the opening O, a resistance of the resistor pattern R may be determined by controlling a thickness of the control gate conductive layer 252 remaining on the resistor region 20.

According to another embodiment, the control gate conductive layer 252 on the resistor region 20 may be completely removed. If a subsequent process is performed to completely remove the control gate conductive layer 252 on the resistor region 20, a resistor pattern R constituted by a single layer may be formed, as illustrated in FIG. 4.

Figure 19:
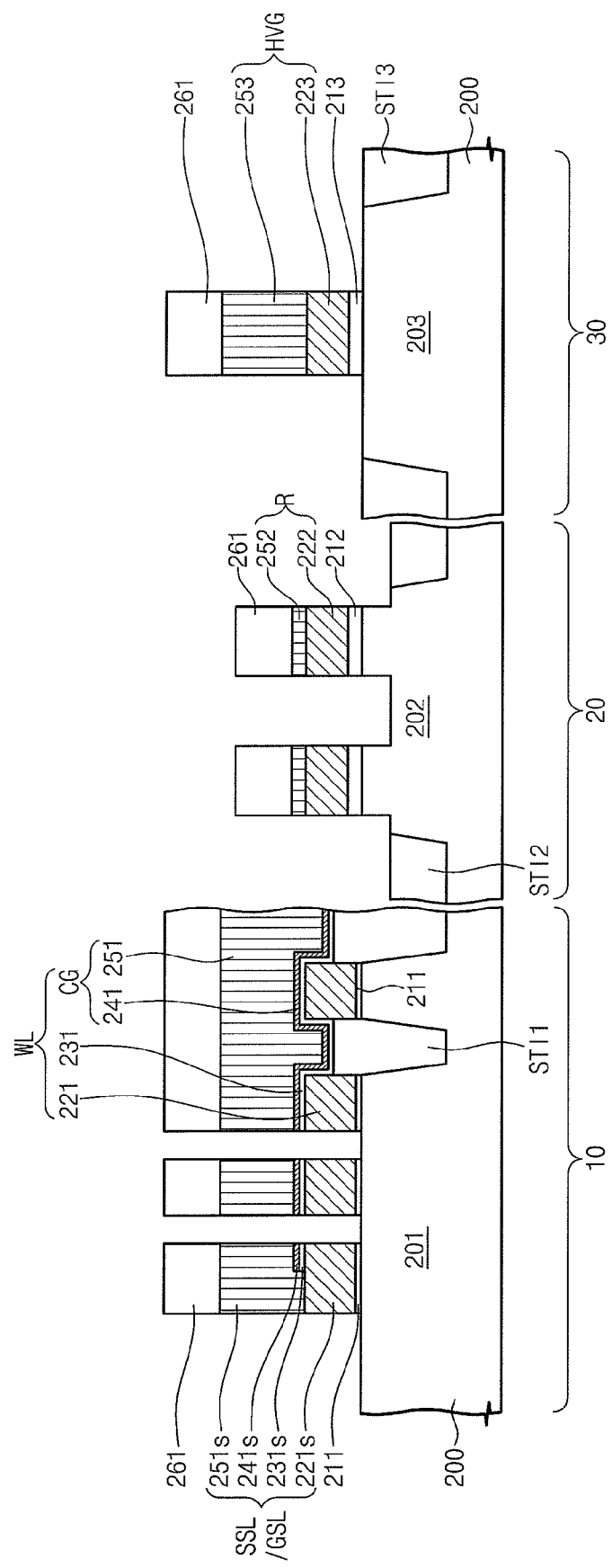

Referring to FIG. 19, as described with reference to FIG. 11, the layers deposited on the semiconductor substrate 200 are patterned to form cell gate electrodes WL and select gate electrodes SSL and GSL on a first active region 201, a resistor pattern R on a second active region 202 and a high voltage gate electrode HVG on a third active region 203 at the same time.

The cell gate electrode WL may include a floating gate conductive pattern 221, an intergate insulating pattern 231, a protection conductive pattern 241 and a control gate conductive pattern 251.

The select gate electrode SSL and GSL may include a lower gate conductive pattern 221s and an upper gate conductive pattern 251s directly contacting the lower gate conductive pattern 221s. An intergate insulating pattern 231s and a protection conductive pattern 241s may be interposed in a portion of between the lower gate conductive pattern 221s and the upper gate conductive pattern 251s.

The high voltage gate electrode HVG may include a lower gate conductive pattern 223 and an upper gate conductive pattern 253 directly contacting the lower gate conductive pattern 223 in a manner similar to the select gate electrode SSL and GSL. Also, an intergate insulating pattern and a protection conductive pattern may be interposed in a portion of between the lower gate conductive pattern 223 and the upper gate conductive pattern 253.

The resistor pattern R may include a lower resistor pattern 222 formed simultaneously with the floating gate conductive pattern 221 and an upper conductive pattern 252 formed simultaneously with the control gate conductive pattern 251. The upper conductive pattern 252 may be thinner than the control gate conductive pattern 251 constituting the cell gate electrodes WL.

Also, since a height of the laminated structure on the resistor region 20 is low, when the gate electrodes WL, SSL/GSL and HVG and the resistor pattern R are formed at the same time, the semiconductor substrate 200 on both sides of the resistor pattern R may be recessed. At this time, a top surface of the semiconductor substrate 200 adjacent to the resistor pattern R may be more deeply recessed than a top surface of the semiconductor substrate 200 adjacent to the cell gate electrode WL.

After forming the gate electrodes WL, SSL/GSL and HVG and the resistor pattern R, impurity regions 205 may be formed on both sides of the gate electrodes WL, SSL/GSL and HVG on the cell array region 10 and the peripheral circuit region 30.

Figure 20:
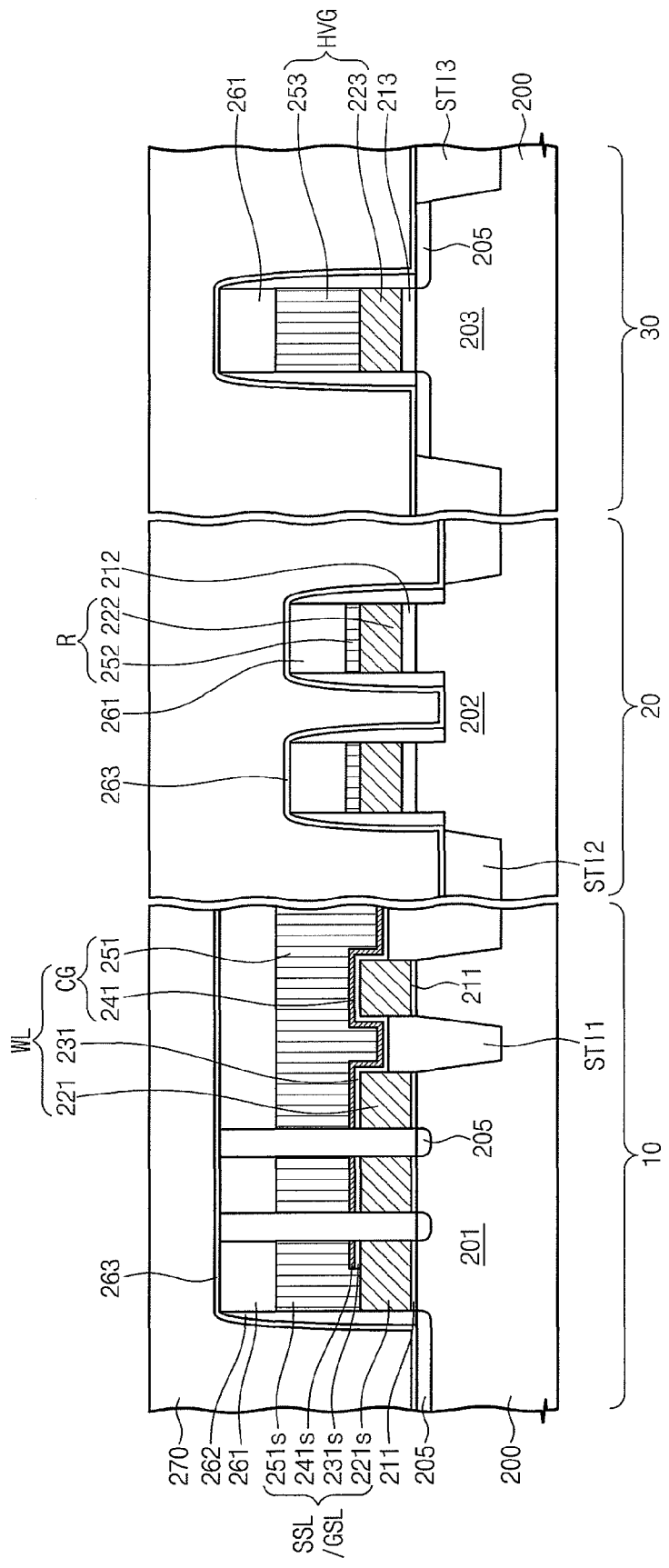

Referring to FIG. 20, as described with reference to FIG. 12, a spacer 262 covering sidewalls of the gate electrodes WL, SSL/GSL and HVG and the resistor pattern R is formed and an etching stop layer 263 and an interlayer insulating layer 270 covering the gate electrodes WL, SSL/GSL and HVG and the resistor pattern R are sequentially formed.

Figure 21:
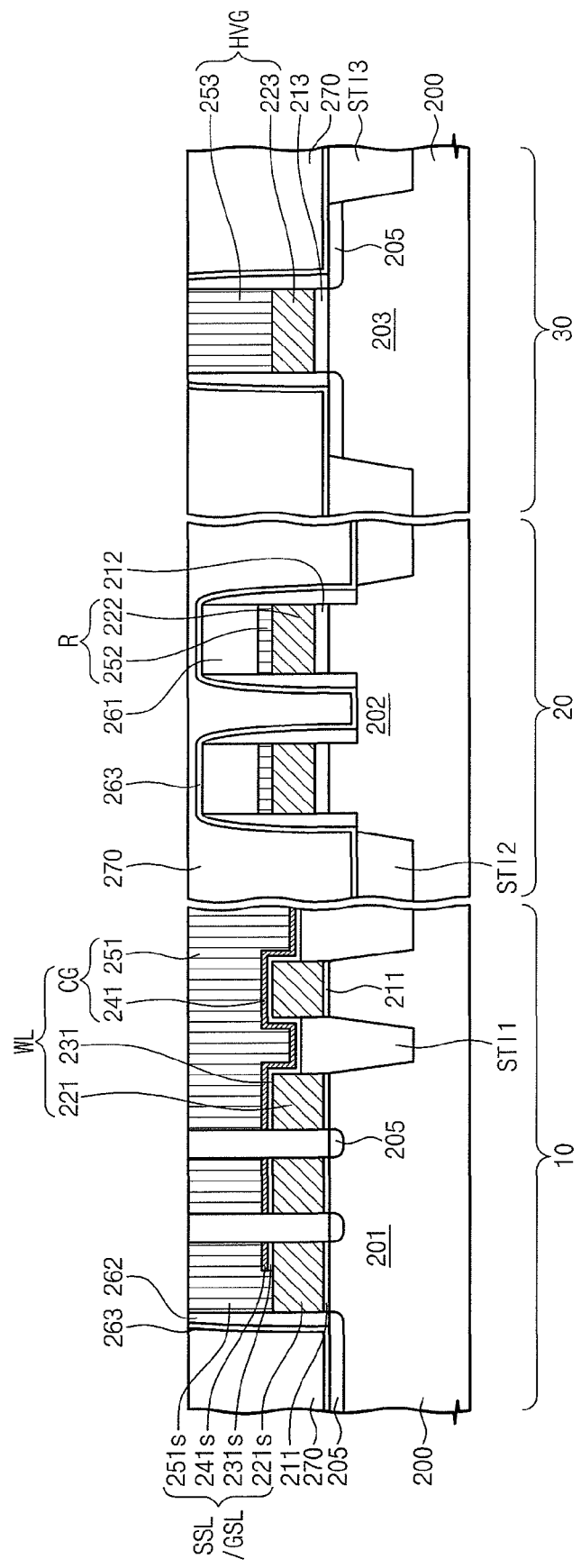
Figure 22:
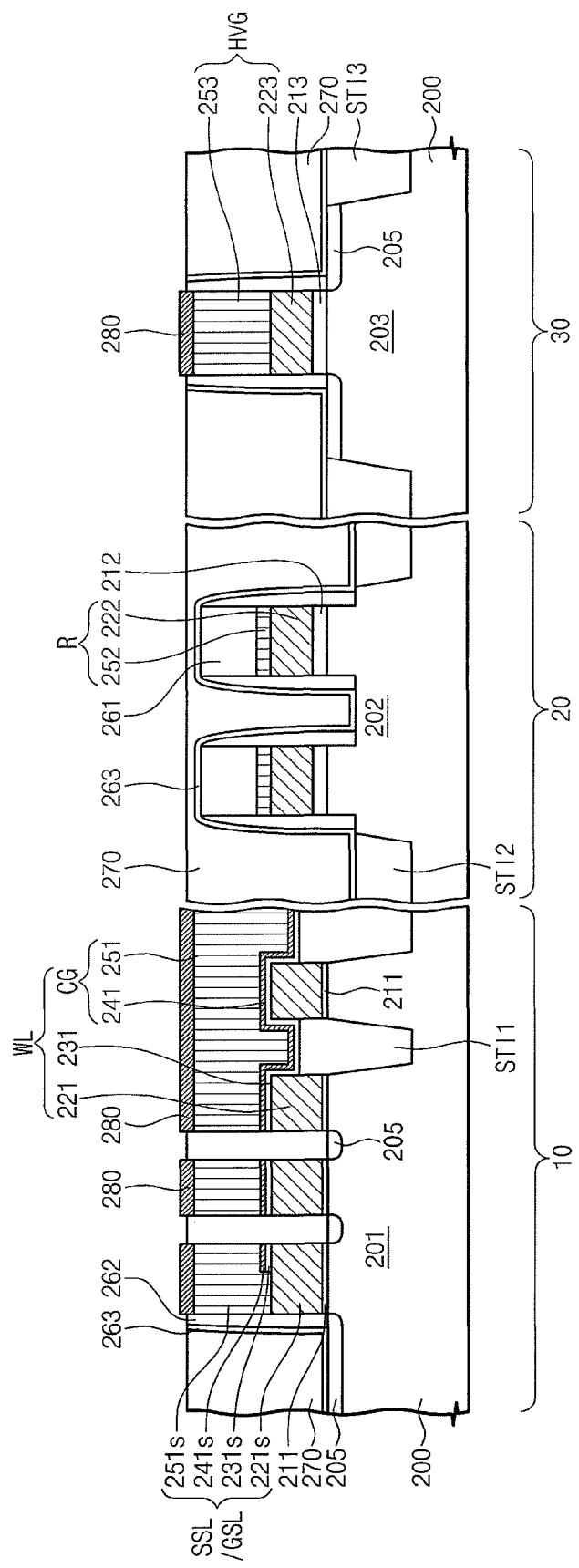

Referring to FIGS. 21 and 22, a silicide layer 280 is formed on top surfaces of the gate electrodes WL, SSL/GSL and HVG on the cell array region 10 and the peripheral circuit region 30.

For example, the interlayer insulating layer 270 may be planarized so that the control gate conductive pattern 251 and upper gate conductive patterns 251s and 253 of the gate electrodes WL, SSL/GSL and HVG are exposed. At this time, since a height difference exists between the upper conductive pattern 252 of the resistor region 20 and the control gate conductive pattern 251 of the cell array region 10, the upper conductive pattern 252 of the resistor region 20 is not exposed.

The silicide layer 280 may be formed using, for example, the silicidation process described with reference to FIG. 14.

Figure 23:
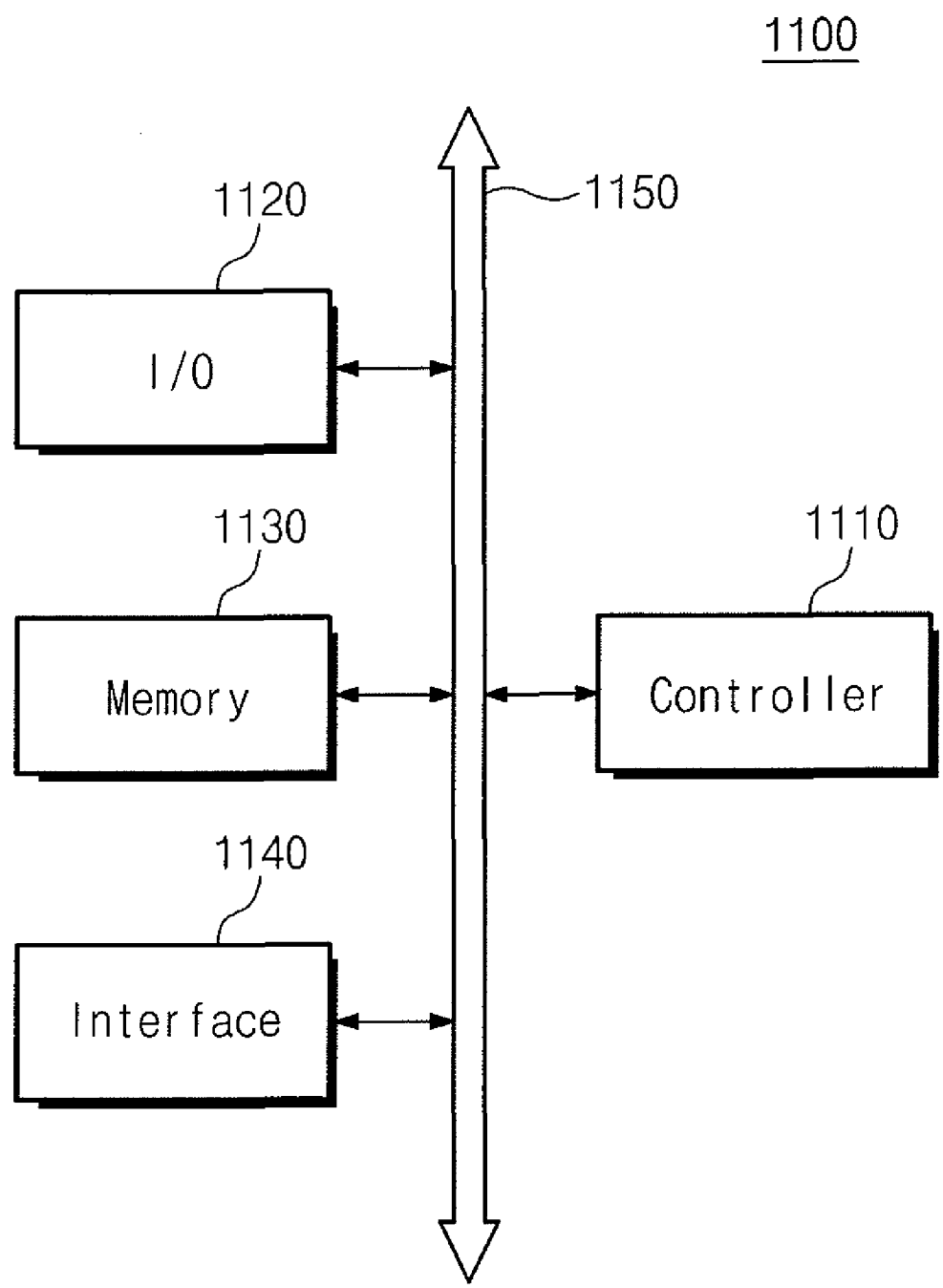
FIG. 23 is a block diagram illustrating an example of a memory system including a nonvolatile memory device in accordance with an exemplary embodiment of the inventive concept.

FIG. 23 is a block diagram illustrating an example of a memory system including a nonvolatile memory device in accordance with embodiments of the inventive concept.

Referring to FIG. 23, a memory system 1100 can be applied to, for example, a PDA, a portable computer, a web tablet, a wireless phone, a mobile phone, a digital music player, a memory card or all the devices that can transmit and/or receive information under a wireless environment.

The memory system 1100 includes a controller 1110, an input/output device 1120 such as, for example, a keypad, a keyboard and a display, a memory 1130, an interface 1140 and a bus 1150. The memory 1130 and the interface 1140 communicate with each other through the bus 1150.

The controller 1110 includes, for example, a microprocessor, a digital signal processor, a micro controller, or other process devices similar to the microprocessor, the digital signal processor and the micro controller. The memory 1130 may be used to store commands executed by the controller 1110. The input/output device 1120 can receive data or a signal from the outside of the memory system 1100 or may output data or a signal to the outside of the memory system 1100. For example, the input/output device 1120 may include a keyboard, a keypad or a display device.

The memory 1130 includes a nonvolatile memory device in accordance with embodiments of the inventive concept. The memory 1130 may further include a different kind of memory, a volatile memory capable of a random access and various kinds of memories.

The interface 1140 transmits data to a communication network or receives data from a network.

Figure 24:
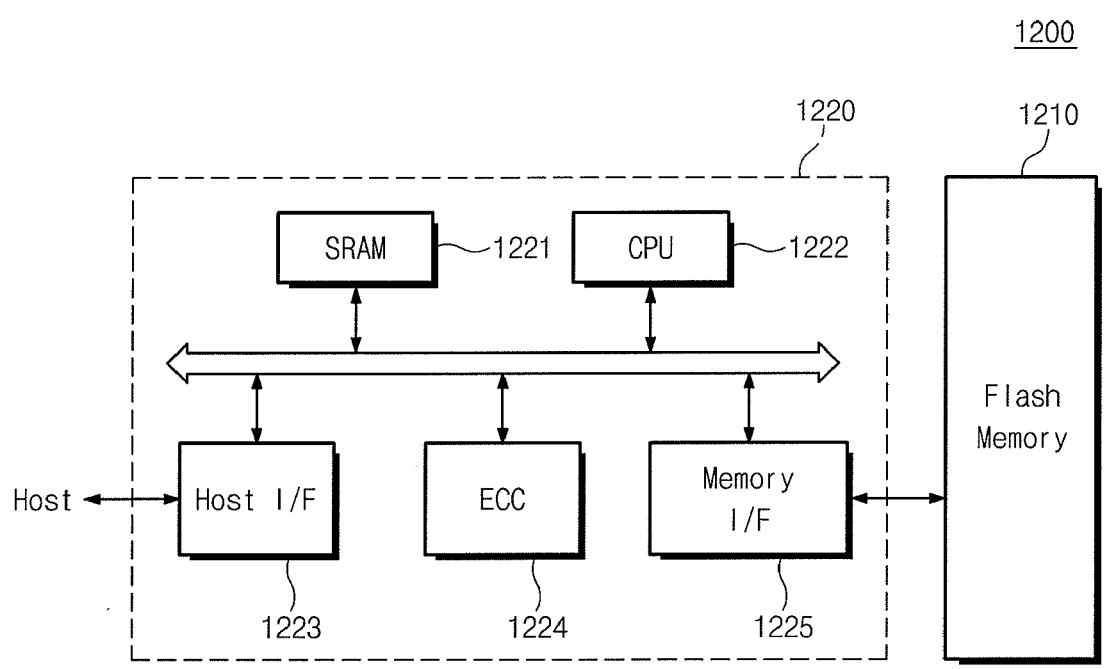
FIG. 24 is a block diagram illustrating an example of a memory card including a nonvolatile memory device in accordance with an exemplary embodiment of the inventive concept.

FIG. 24 is a block diagram illustrating an example of a memory card including a nonvolatile memory device in accordance with an embodiment of the inventive concept.

Referring to FIG. 24, a memory card 1200 for supporting a storage capacity of huge amounts of data is fitted with a flash memory device 1210 in accordance with the inventive concept. The memory card 1200 in accordance with the inventive concept includes a memory controller 1220 controlling the whole data exchange between a host and the flash memory device 1210.

A SRAM 1221 is used as an operation memory of a central processing unit (CPU) 1222. A host interface 1223 includes data exchange protocols of the host accessing to the memory card 1200. An error correction code (ECC) block 1224 detects and corrects errors included in data read from the multi-bit flash memory device 1210. A memory interface (I/F) 1225 interfaces with the flash memory device 1210 of the inventive concept. The central processing unit (CPU) 1222 performs the whole control operations for a data exchange of the memory controller 1220. Although not illustrated in the drawing, the memory card 1200 may further include a ROM (not illustrated) storing code data for interfacing with the host.

Figure 25:
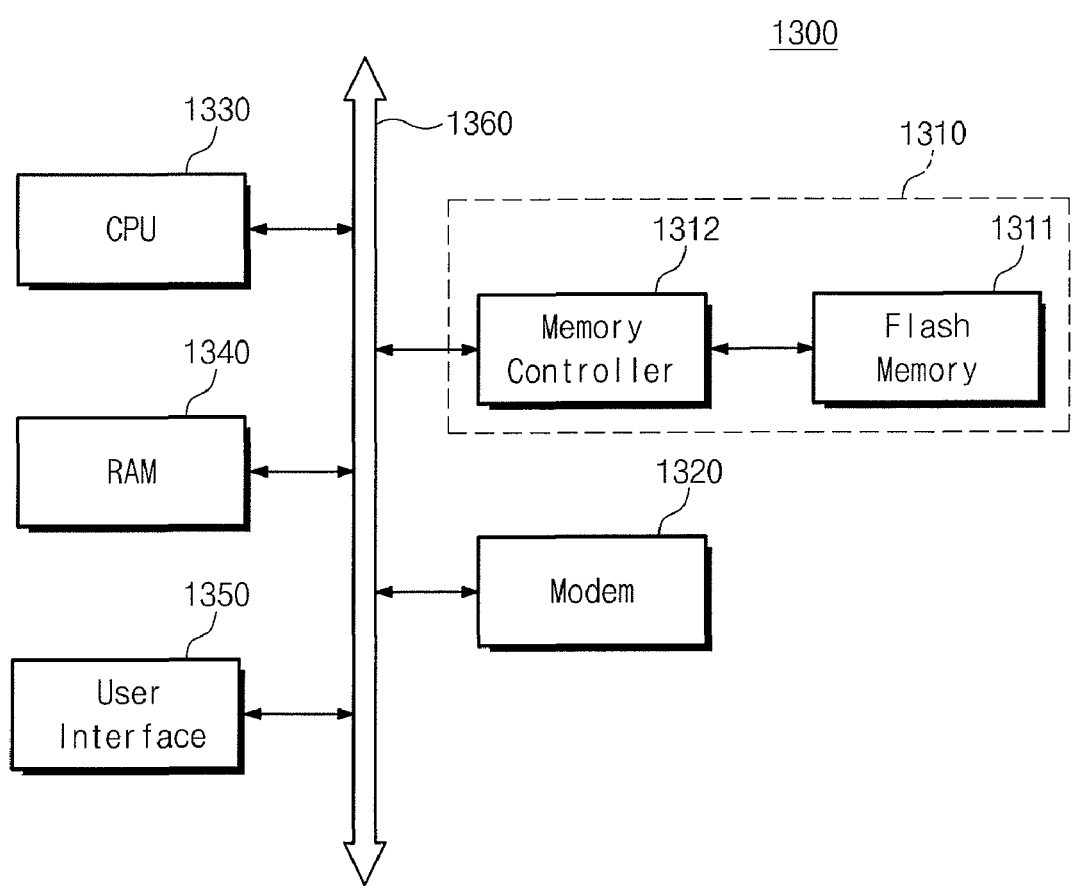
FIG. 25 is a block diagram illustrating an example of an information processing system including a nonvolatile memory device in accordance with an exemplary embodiment of the inventive concept.

FIG. 25 is a block diagram illustrating an example of an information processing system including a nonvolatile memory device in accordance with the inventive concept.

Referring to FIG. 25, a flash memory system 1310 of the inventive concept is built in an information processing system such as, for example, a mobile device or a desktop computer. The information processing system 1300 includes, for example, a flash memory system 1310, and a modem 1320, a central processing unit (CPU) 1330, a RAM 1340 and a user interface 1350 that are electrically connected to a system bus 1360. The flash memory system 1310 is constituted to be the same with the memory system or the flash memory system described before. The flash memory system 1310 stores data processed by the central processing unit (CPU) 1330 or data received from the outside. The flash memory system 1310 can be constituted by a solid state drive (SSD). In this case, the information processing system 1300 can stably store huge amounts of data in the flash memory system 1310. As reliability increases, the flash memory system 1310 can reduce resources required to correct errors, thereby providing a high speed data exchange function to the information processing system 1300. Although not illustrated in the drawing, the information processing system 1300 may further include, for example, an application chip set, a camera image processor (CIS), an input/output device or the like.

The flash memory device or the memory system in accordance with the inventive concept may be mounted by various types of packages such as, for example, PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

According to a semiconductor memory device and a method of manufacturing the semiconductor memory device in accordance with embodiments of the inventive concept, a resistor pattern can be formed to be even with a gate electrode by forming the resistor pattern on an active region. Thus, a height difference between the gate electrode and the resistor pattern can be uniformly maintained. As a result, a silicide layer can be formed only on the gate electrode and thereby a reduction in the resistance of the resistor pattern may be prevented.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of manufacturing a semiconductor memory device, comprising:
    forming a first conductive layer on a semiconductor substrate including a first active region and a second active region;
    forming a second conductive layer covering the first conductive layer on the first active region and defining an opening exposing a top surface of the first conductive layer on the second active region;
    forming a third conductive layer covering top surfaces of the first conductive layer and the second conductive layer on the first active region and the second active region;
    forming a gate electrode on the first active region and a resistor pattern on the second active region by patterning the first conductive layer, the second conductive layer and the third conductive layer; and
    forming a silicide layer on the gate electrode by performing a silicidation process,
    wherein the opening provides a height difference between top surfaces of the gate electrode and the resistor pattern and wherein the silicidation process is performed so as to prevent the silicide layer from being formed on the resistor pattern by the height difference.

2. The method of claim 1, wherein before forming the second conductive layer, further comprising forming a device isolation layer defining a boundary of the first active region and the second active region by patterning the first conductive layer and the semiconductor substrate, wherein a distance between a bottom surface of the resistor pattern and a top surface of the semiconductor substrate is smaller than one tenth of a thickness of the device isolation layer.

3. The method of claim 1, wherein the forming of the gate electrode and the resistor pattern comprises recessing a top surface of the semiconductor substrate adjacent to the gate electrode and the resistor pattern and wherein a top surface of the semiconductor substrate adjacent to the resistor pattern is more deeply recessed than a top surface of the semiconductor substrate adjacent to the gate electrode.

4. The method of claim 1, wherein the forming of the second conductive layer comprises:

forming a conductive layer covering the first conductive layer on the first active region and the second active region, the conductive layer having a flat top surface; and reducing a thickness of the conductive layer on the second active region.

5. The method of claim 1, wherein the forming of the second conductive layer comprises recessing a top surface of the first gate conductive layer on the second active region so that a thickness of the first gate conductive layer on the second active region is smaller than a thickness of the first gate conductive layer on the first active region.

6. The method of claim 1, wherein before forming the first conductive layer, further comprising forming insulating layers on the first active region and the second active region, wherein a thickness of the insulating layer on the first active region is different from a thickness of the insulating layer on the second active region.

7. A method of manufacturing a semiconductor memory device, comprising:

preparing a semiconductor substrate including a first active region and the second active region defined by a device isolation layer;

forming a thin layer structure in which a first conductive layer, a second conductive layer and the third conductive layer are sequentially stacked on the semiconductor substrate, wherein the first conductive layer and the third conductive layer on the second active region are directly in contact with each other;

forming a gate electrode on the first active region and a resistor pattern on the second active region by patterning the thin layer structure; and forming a silicide layer on a top surface of the gate electrode, wherein a distance between a top surface of the semiconductor substrate and a top surface of the resistor pattern is smaller than a distance between a top surface of the semiconductor substrate and the top surface of the gate electrode.

8. A method of manufacturing a semiconductor memory device, comprising:

forming a tunnel insulating layer on a cell array region of a semiconductor substrate;

forming a buffer insulating layer on a resistor region of the semiconductor substrate and a gate insulating layer on a peripheral circuit region of the semiconductor substrate;

forming a first gate conductive layer on the tunnel insulating layer, the buffer insulating layer and the gate insulating layer;

forming a first device isolation layer, a second device isolation layer and a third device isolation layer in the semiconductor substrate, thereby defining a first active region, a second active region, and a third active region in the cell array region, the resistor region and the peripheral region of the semiconductor substrate, respectively;

sequentially forming an intergate insulating layer and a second gate conductive layer on the first gate conductive layer;

etching the second gate conductive layer and the intergate insulating layer in the resistor region to remove the second gate conductive layer and the intergate insulating layer from the resistor region, thereby forming an opening exposing the first gate conductive layer in the resistor region;

forming a third gate conductive layer conformally on the cell array region, the resistor region and the peripheral circuit region;

patterning the third gate conductive layer, the second gate conductive layer, the intergate insulating layer, the first gate conductive layer, the buffer insulating layer, the gate insulating layer and the tunnel insulating layer together to form a cell gate electrode and a select gate electrode on the first active region, a resistor pattern on the second active region and a high voltage gate electrode on the third active region;

forming an interlayer insulating layer covering the cell gate electrode, the select gate electrode, the resistor pattern and the high voltage gate electrode;

etching the interlayer insulating layer so that top surfaces of the cell gate electrode, the select gate electrode and the high voltage gate electrode are exposed;

forming a silicide layer on the exposed top surfaces of the cell gate electrode, the select gate electrode and the high voltage gate electrode by performing a silicidation process, wherein there is a height difference between the top surface of the cell gate electrode and a top surface of the resistor pattern such that the silicide layer is prevented from being formed on the resistor pattern by the height difference; and forming an upper insulating layer covering the silicide layer.

9. The method of claim 8, wherein before forming the interlayer insulating layer, further comprising forming source/drain regions in the first active region on both sides of the cell gate electrode and on both sides of the select gate electrode and in the third active region on both sides of the high voltage gate electrode; and forming a spacer covering sidewalls of the cell gate electrode, the select gate electrode, the resistor pattern and the high voltage gate electrode, and forming an etch stop layer conformally covering the cell gate electrode, the select gate electrode, the resistor pattern and the high voltage gate electrode including the spacer on sidewalls thereof.

10. The method of claim 8, wherein the integrate insulating layer conformally covers a top surface and a sidewall of the first gate conductive layer and top surfaces of the first device isolation layer, the second device isolation layer and the third device isolation layer, wherein at least one of the tunnel insulating layer, the buffer insulating layer and the gate insulating layer are formed of a material selected from the group consisting of aluminum oxide ($Al_2O_3$), hafnium oxide ($HfO_2$), zirconium oxide ($ZrO_2$), lanthanum oxide ($La_2O_3$), tantalum oxide ($TaO_3$), titanium oxide ($TiO_2$), strontium titanate $SrTiO_3$(STO), barium strontium titanate $(Ba, Sr)TiO_3$ (BST) or a complex layer stacked by combinations thereof and wherein the first gate conductive layer, the second gate conductive layer and the third gate conductive layer are each formed of a polysilicon layer doped with an n-type or a p-type impurity.

* * * * *